United States Patent [19]

Kanai et al.

[11] Patent Number: 5,468,521
[45] Date of Patent: Nov. 21, 1995

[54] METHOD FOR FORMING A PHOTOELECTRIC DEPOSITED FILM

[75] Inventors: Masahiro Kanai; Yasushi Fujioka, both of Hikone; Takehito Yoshino; Tadashi Hori, both of Nagahama, all of Japan

[73] Assignee: Canon Kabushiki Kaisha, Tokyo, Japan

[21] Appl. No.: 334,032

[22] Filed: Nov. 2, 1994

Related U.S. Application Data

[63] Continuation of Ser. No. 967,238, Oct. 27, 1992, abandoned.

[30] Foreign Application Priority Data

Oct. 28, 1991 [JP] Japan ..................... 3-281644

[51] Int. Cl.$^6$ ............... B05D 3/06; H01L 31/00
[52] U.S. Cl. ............ 427/575; 427/574; 427/578; 427/255.5; 136/243; 437/4
[58] Field of Search ........................ 427/575, 578, 427/574, 255.5; 437/4; 136/243; 118/719, 729, 723 MW, 723 ME, 723 MR, 723 MA

[56] References Cited

U.S. PATENT DOCUMENTS

| | | | |
|---|---|---|---|
| 4,400,409 | 8/1983 | Izu et al. | 427/39 |
| 4,663,829 | 5/1987 | Hartman et al. | 29/572 |
| 4,664,951 | 5/1987 | Dochler | 427/248.1 |
| 4,763,601 | 8/1988 | Saida et al. | 118/718 |
| 4,920,917 | 5/1990 | Nakatani et al. | 118/718 |
| 4,951,602 | 8/1990 | Kanai | 118/719 |
| 5,180,434 | 1/1993 | DiDio et al. | 427/570 |

OTHER PUBLICATIONS

S. Guha et al., "A Novel Design for Amorphous Silicon Solar Cells," 20th IEEE Photovoltaic Specialists Conference—1988, vol. 1, pp. 78–84.

*Primary Examiner*—Roy V. King
*Attorney, Agent, or Firm*—Fitzpatrick, Cella, Harper & Scinto

[57] ABSTRACT

A deposited film forming method includes the steps of: continuously carrying a long substrate into or out of a vacuum chamber, flowing a first deposited film forming gas in a reverse direction parallel to the substrate and opposite to a conveying direction of the substrate from first gas discharging means into the vacuum chamber, exhausting the gas from first gas exhausting means, flowing a second deposited film forming gas in a forward direction parallel to the substrate and equivalent to the conveying direction of the substrate, exhausting the gas through the second gas exhausting means, and applying a discharge energy to the first and second gases.

26 Claims, 9 Drawing Sheets

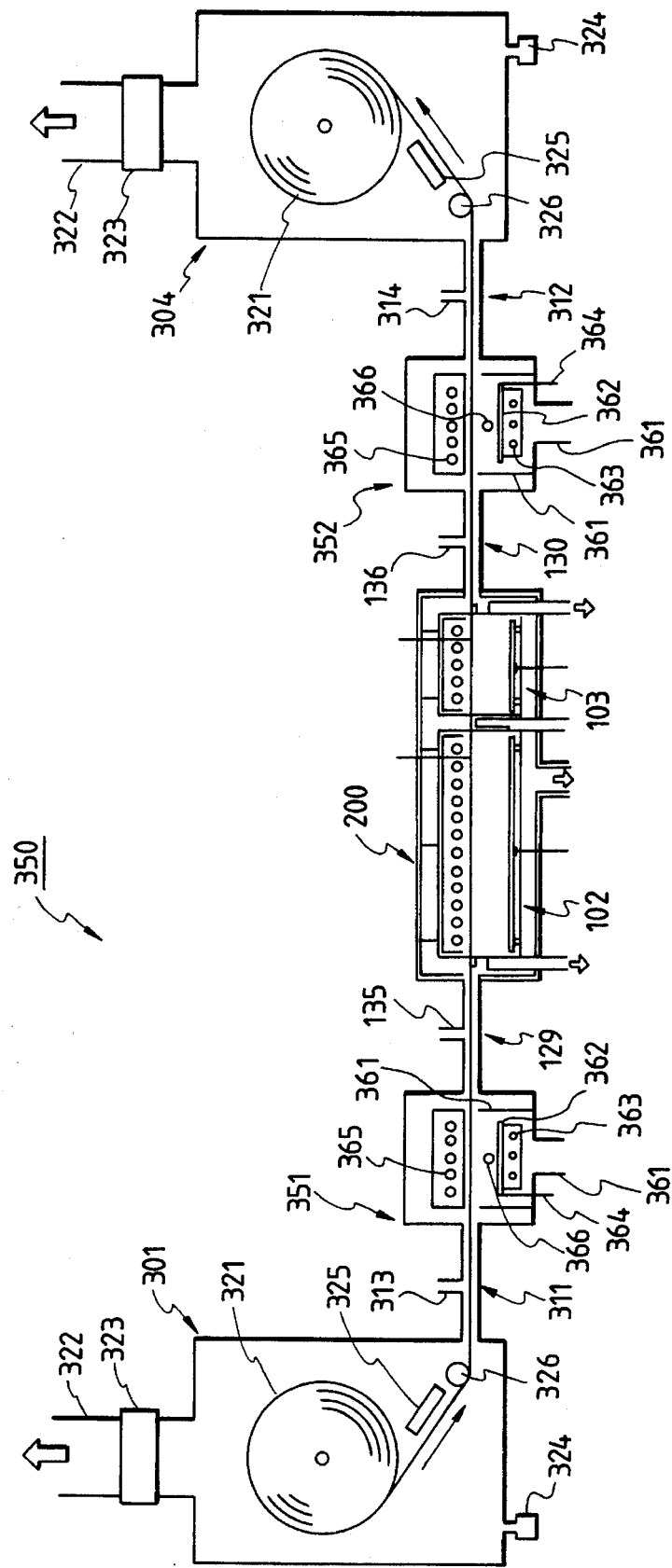

METHOD FOR FORMING A PHOTOELECTRIC DEPOSITED FILM

This application is a continuation, of application Ser. No. 07/967,238 filed Oct. 27, 1992, which is now abandoned.

BACKGROUND OF THE INVENTION

1. Field of the Invention

The present invention relates to a deposited film forming method for continuously forming deposited film on a long-size substrate by plasma CVD method, and a deposited film forming apparatus therefor, and particularly to a deposited film forming method and a deposited film forming apparatus for forming deposited film having a composition distribution provided in a direction of film thickness.

2. Related Background Art

In recent years, the demand for the electric power has been increasing worldwide, so that the production of the electric power has been more active, but with the growth of production, problems associated with thermal power generation or atomic power generation such as environmental pollution or global warming have appeared. In these situations, the solar cell generation utilizing the sun rays has been noted because it does not cause any problems such as environmental pollution or global warming, with fairer distribution of the resource of the solar rays, and it can meet the demand for the electric power which will further increase in the future.

To put solar cell electrical generation to practical use, it is required that the solar cell has a sufficiently high photoelectric conversion efficiency, as well as excellent characteristics and stability, and is suitable for mass production. Due larger electrical scale generation, a larger solar cell will be required. For these reasons, an amorphous silicon type solar cell has been proposed in which a semiconductor thin film made of an amorphous silicon is deposited on a substrate made of a glass or metallic sheet which is relatively cheap by decomposing a readily available source gas such as silane by glow discharge. This amorphous silicon type solar cell has been noted because it can provide an improved mass productivity and a lower cost, compared with a solar cell made of a single crystal silicon, for which various fabrication methods therefor have been proposed.

In the solar cell generation, unit modules of the solar cell are interconnected in series or parallel to form a unit so that a desired current or voltage is obtained. It is required that in each unit module, no disconnection or short-circuit may occur, and there is less dispersion in the output voltage or output current between unit modules. For this purpose, the uniformity in the characteristics of a semiconductor layer is the most determinative factor in the step of fabricating the unit module. Also, to facilitate the module design and simplify the assembling process of module, the ability to form a semiconductor deposited film having excellent characteristics over a large area can provide a greater mass production of the solar cell and yield a great reduction of production cost.

The semiconductor layer which is an important component of the solar cell contains semiconductor junctions such as pn junction or pin junction. Such a semiconductor junction is formed by sequentially laminating semiconductor layers having different conduction types, or ion implanting or thermally diffusing a dopant having a different conduction type into the semiconductor layer of a certain conduction type. In fabricating the amorphous silicon type solar cell as above described, it is well known that a source gas containing an element as a dopant such as phosphine ($PH_3$) or diborane ($B_2H_6$) is mixed into a main source gas such as a silane gas. The mixed source gas is decomposed by glow discharge or the like to obtain a semiconductor film having a desired conduction type, and the semiconductor film is sequentially laminated on a desired substrate, so that a semiconductor junction is easily obtained. Thus, in fabricating an amorphous silicon type solar cell, it is common that by providing a separate film forming chamber corresponding to each semiconductor layer, each semiconductor layer is formed within this film forming chamber.

A deposited film forming method relying on the plasma CVD suitable for the fabrication of such an amorphous silicon type solar cell has been disclosed in U.S. Pat. No. 4,400,409 with regard to the roll to roll mode. This deposited film forming method is such that a plurality of glow discharge regions are provided, a long-size strip-like substrate is disposed along a passage penetrating through those glow discharge regions in sequence. Semiconductor layers having necessary conduction types are deposited in respective glow discharge regions separately provided while the strip-like substrate is being continuously conveyed in a longitudinal direction thereof. Thereby, the solar cell having a desired semiconductor junction can be formed consecutively. Note that in this deposited film forming method, to prevent a dopant gas for use in each glow discharge region from diffusing or mixing into other glow discharge regions, the glow discharge regions are separated from each other by a slit-like separation passage called as a gas gate, in which separation passage there is a flow of a scavenging gas such as Ar or $H_2$. With such a constitution, the deposited film forming method according to the roll to roll mode can be suitably applied to the fabrication of semiconductor elements in the solar cell.

On the other hand, an attempt for improving the photoelectric conversion efficiency of an amorphous silicon type solar cell has been made in which it has been found that when group-IV alloy semiconductors such as a-SiGe:H, a-SiGe:F, a-SiGe:H:F, a-SiC:H, a-SiC:F, a-SiC:H:F is used as the i-type (intrinsic) semiconductor layer, the forbidden band width (band gap: $E_g^{opt}$) of this i-type semiconductor layer is appropriately changed continuously in a direction of film thickness from the incident side of light, so that the open voltage ($V_{oc}$) or curve factor (fill factor: FF) can be greatly improved (20th IEEE PVSC. 1988, "A Novel Design for Amorphous Silicon Solar Cells" S Guha J. Yang, et al.).

However, the deposited film forming method as above described has a drawback. The large area deposited film can not be uniformly formed even though the composition is continuously changed in the direction of film thickness to change continuously the band gap. This drawback is specifically described in the following.

In the deposited film forming method according to the roll to roll mode as above described, the deposited film is formed while the strip-like substrate is being continuously moved, whereby the formation of the deposited film on the substrate is carried out while the substrate passes through the glow discharge regions. Accordingly, the film thickness of the deposited film can be controlled relatively easily by the deposition rate and the passing speed through the glow discharge regions. On the other hand, in order to provide a composition distribution in a direction of film thickness, it is necessary to provide a distribution in a moving direction of the substrate in a film forming atmosphere within the glow discharge region, because the substrate is moved continuously. However, it is difficult to provide repetitively such a distribution in the film forming atmosphere which depends on the composition or pressure of source gas, or the energy density of glow discharge. Also, in a conventional deposited film forming method with the substrate fixed therein, to provide the distribution in the film forming atmosphere was not conducted, because to continuously change the forbidden band width in a direction of film thickness would impair the uniformity of the deposited film.

SUMMARY OF THE INVENTION

An object of the present invention is to provide a deposited film forming method and a deposited film forming apparatus wherein a deposited film having a composition distribution in a direction of film thickness can be continuously formed on a large substrate without variation in the characteristics.

In the deposited film forming method and apparatus, a flow of a source gas containing a plurality of kinds of deposited film source materials is formed within the vacuum vessel in a forward direction equivalent and parallel to a moving direction of the substrate and a reverse direction opposite and parallel to the moving direction of the substrate, while a substrate is continuously moved in a longitudinal direction of the substrate within the vacuum vessel. A plasma is excited within the vacuum vessel by applying a discharge energy to each of a plurality of discharge means arranged in a longitudinal direction to the substrate, whereby deposited film is formed on the substrate. Since the flow of the source gas containing a plurality of kinds of deposited film source materials is formed in the forward and reverse directions parallel to the moving direction of the substrate, and plasma is excited by applying a discharge energy to each of a plurality of discharge means arranged in the longitudinal direction of the substrate, the film forming conditions can vary in respect to the moving direction of the substrate. Thus, composition of deposited film formed can be varied at different positions in the moving direction of the substrate. On the other hand, the substrate is continuously moved, and the deposited film is continuously formed and grown, so that the deposited film formed on the substrate can have a different composition in a direction of film thickness.

In the deposited film forming method of the present invention, in order to form a flow of a source gas containing a plurality of kinds of deposited film source materials in the forward and reverse directions parallel to the moving direction of the substrate, it suffices that source gas discharge means for discharging the source gas uniformly over a width direction of the substrate is provided opposed to the substrate, and source gas exhaust means for exhausting the source gas over the width direction of the substrate is provided. It is desirable that the source gas discharge means and the source gas exhaust means are provided in a pair, but it will be appreciated that the source gas exhaust means may be provided at two positions on the forward and reverse sides along the moving direction of the substrate. It will be also appreciated that a plurality of pairs of the source gas discharge means and the source gas exhaust means are provided. In this case, the source gas flows in a direction parallel to the moving direction of the substrate in some portion thereof, but in a direction opposite to the moving direction of the substrate in the other portion. That is, the source gas can flow appropriately formed in a combination of the forward and reverse directions relative to the moving direction of the substrate.

The source gas discharge means is provided with a gas discharge hole for discharging the source gas into a vacuum vessel. The shape of this gas discharge hole may be arbitrary such as slit-like, circular, elliptical, sponge-like or mesh-like, and the number of gas discharge holes may be also arbitrary, although it is required that the gas be discharged uniformly over the width direction of the substrate. In this case, it is desirable that the diameter of the gas discharge hole is adjusted so as to increase the amount of gas discharged through the gas discharge hole corresponding to the neighborhood of an end portion of the substrate in its width direction, to the extent depending on the internal pressure of vacuum vessel and the flow rate of the source gas, so that the flow of the source gas parallel to the moving direction of the substrate can be accomplished.

On the other hand, the source gas exhaust means is provided with a gas exhaust hole for exhausting the source gas. The shape of this gas exhaust hole may be arbitrary such as slit-like, circular, elliptical, sponge-like or mesh-like, and the number of gas exhaust holes may be also arbitrary, although it is required that the gas be exhausted uniformly over the width direction of the substrate. In this case, it is desirable to adjust the diameter of the gas exhaust hole to increase the amount of gas sucked through the gas exhaust hole corresponding to the neighborhood of an end portion of the substrate in its width direction, the extent depending on the internal pressure of vacuum vessel and the flow rate of the source gas, so that the flow of the source gas parallel to the moving direction of the substrate can be accomplished.

The source gas contains a plurality of kinds of deposited film source materials, and desirably has different decomposition and deposition efficiencies for respective deposited film source materials by plasma, with which the degree of change in the film forming condition along the moving direction of the substrate can be made larger. The decomposition and deposition efficiencies can be changed variously depending on the kind of the discharge energy or the discharge conditions (e.g., discharge power, discharge frequency) for generating the plasma, the flow rate, flow speed and pressure of the source gas within the vacuum vessel, and whether the dilution gas for diluting the source gas may exist or not.

In the deposited film forming method of the present invention, it is preferable that within the vacuum vessel, there is provided a film forming vessel through which the substrate penetrates movably, within which the source gas flows, plasma is produced, and a deposited film is formed on the substrate. In this case, in order to prevent the discharge energy or produced plasma from leaking out of this portion of the film forming vessel through which the substrate penetrates, a grounded guard electrode should be provided in this portion near the substrate. The distance between the guard electrode and the substrate is desirably equal to or less than the length of a dark space (a dark part of glow discharge) in the produced plasma, for example, when the discharge energy is at a high frequency (typically, 13.56 MHz). When the discharge energy is a microwave (typically, 2.45 GHz), it is preferably one-fourth or less the wavelength of microwave, and more preferably one-twentieth or less the wavelength. The length of a portion of the guard electrode opposed to the substrate along the moving direction of the substrate is preferably five times or greater the distance between the substrate and the guard electrode, and more preferably ten times or greater. Of course, the guard electrode is desirably provided corresponding to the entire width of the substrate in the width direction thereof.

BRIEF DESCRIPTION OF THE DRAWINGS

FIG. 4 is a schematic cross-sectional view showing the constitution of a continuous deposited film forming apparatus having incorporated the deposited film forming apparatus as shown in FIG. 2.

DETAILED DESCRIPTION OF THE PREFERRED EMBODIMENTS

The preferred embodiments of the present invention will be described below with reference to the drawings.

Figure 1:
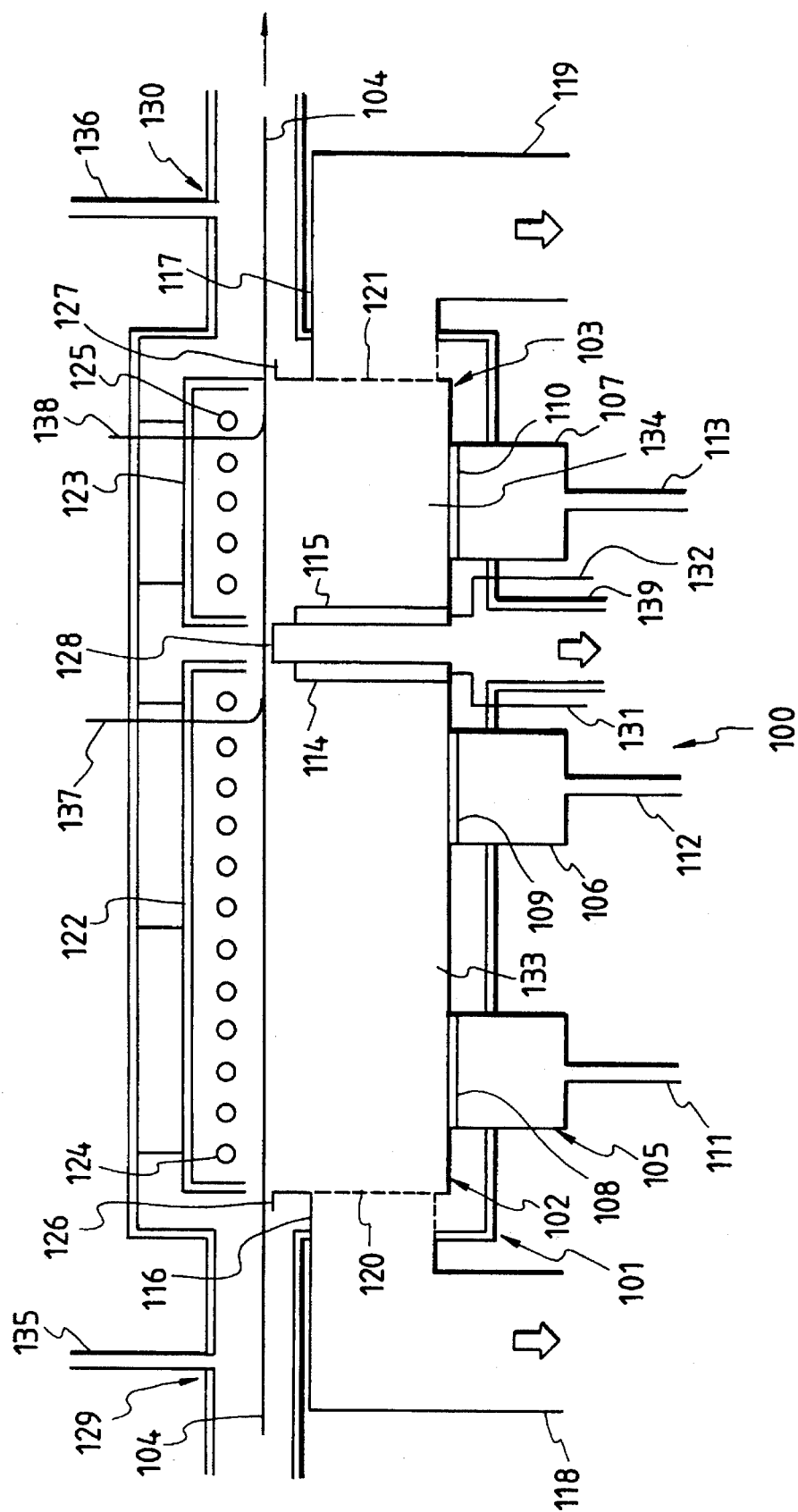
FIG. 1 is a schematic cross-sectional view showing the constitution of a deposited film forming apparatus for use in carrying out a deposited film forming method according to an embodiment of the present invention.

A deposited film forming apparatus 100 as shown in FIG. 1 is composed of a substantially rectangular parallelepiped vacuum vessel 101, and first and second film forming vessels 102, 103 provided within the vacuum vessel 101. The vacuum vessel 101 and each film forming vessel 102, 103 are made of metal, and grounded therein. A long-size strip-like substrate 104 on which deposited film is formed is introduced past a gas gate 129 attached on a side wall to the left of the vacuum vessel 101, as shown, or on the inlet side thereof, and led through a first film forming vessel 102 and a second film forming vessel 103 past a gas gate 130 attached on a side wall to the right of the vacuum vessel 101 as shown or on the outlet, side thereof out of the vacuum vessel 101. To each gas gate 129, 130 is connected a gate gas supply tube 135, 136 for supplying a gate-gas. The strip-like substrate 104 can be continuously moved from a substrate delivery vessel (not shown) connected to the gas gate 129 on the inlet side toward a substrate winding vessel (not shown) connected to the gas gate 130 on the outlet side. Also, on the vacuum vessel 101, an exhaust tube 139 is attached to directly exhaust the vacuum vessel 101, and connected to exhausting means (not shown) such as a vacuum pump.

The first film forming vessel 102 has first and second applicators 105, 106 mounted in juxtaposition along a moving direction of the strip-like substrate 104 so as to be opposed to the strip-like substrate 104 penetrating through the first film forming vessel 102. Each applicator 105, 106 serves to introduce the microwave energy into the first film forming vessel 102, and connected to one end of a respective wave guide 111, 112 with the other end thereof connected to a microwave power source (not shown). At the position of attaching each applicator 105, 106 to the first film forming vessel 102, there is provided a respective microwave introducing window 108, 109 made of a material capable of transmitting the microwave.

A first gas discharger 114 for discharging the source gas is mounted on a side wall of the first film forming vessel 102 on the outlet side or to the right thereof, and an exhaust tube 116 is attached to a side wall thereof on the inlet side or to the left as shown so as to be opposed to the first gas discharger 114. On the surface of the first gas discharger 114, a number of gas discharge holes (not shown) for discharging the source gas are provided. The first gas discharger 114 has one end of a gas supply tube 131 attached thereto which is connected to a source gas supply source (not shown) such as a gas bomb. On the other hand, the exhaust tube 116 is connected via a connecting tube 118 to exhausting means (not shown) such as a vacuum pump. On a mounting portion of the exhaust tube 116 on the first film forming vessel 103 is attached a wire gauze 120 for the adjustment of the exhaust flow, and preventing the microwave energy from leaking therefrom.

On the opposite side of the strip-like substrate 104 to the first and second applicators 105, 106 within the first film forming vessel 102, there are provided a number of infrared lamp heaters 124 and a lamp house 122 for efficiently concentrating radiant heat from the infrared lamp heaters 124 onto the strip-like substrate. Also, there is attached a thermocouple 137 for monitoring the temperature of the strip-like substrate 104 heated by the infrared lamp heaters 124, in contact with the strip-like substrate 104.

The second film forming vessel 103 has substantially the same constitution as the first film forming vessel 102, in which a third applicator 107 is attached to be opposed to the strip-like substrate 104. The third applicator 107 has a waveguide 113 attached thereto which is connected to the microwave power source not shown, with a mounting portion of the third applicator 107 serving as a microwave introducing window 110.

On the side wall of the second film forming vessel 103 on the inlet side, a second gas discharger 115 is attached and connected via a source gas supply tube 132 to a source gas supply source not shown. Also, on the side wall of the second film forming vessel 103 on the outlet side, an exhaust tube 117 is attached to be opposed to the second gas discharger 115, and connected via a connecting tube 119 to exhausting means (not shown). On a mounting portion of the exhausting tube 117 on the second film forming vessel 103, there is provided a wire gauze 121. Further, the second film forming vessel 103, like the first film forming vessel 102, is provided with infrared lamp heaters 125, a lamp house 123 and a thermocouple 138.

The strip-like substrate 104, penetrating through the first and second film forming vessels 102, 103, is introduced through an opening portion provided on a side wall of the inlet side (to the left as shown) into the first film forming vessel 102, then led out through an opening portion provided on the side wall of the outlet side (to the right as shown), and subsequently introduced through an opening portion provided on a side wall of the inlet side into the second film forming vessel 103, and then led out through an opening portion of the outlet side. The opening portion of the first film forming vessel 102 on the inlet side, and the opening portion of the second film forming vessel on the outlet side, are provided with guard electrodes 126, 127, respectively. Since the opening portion of the first film forming vessel 102 on the outlet side and the opening portion of the second film forming vessel 103 on the inlet side are adjacent to each other, there is provided a guard electrode 128 so as to connect these both opening portions. Each of guard electrodes 126 to 128 is provided opposed to and close to the front surface of the strip-like substrate 104 (which is opposite each applicator 105 to 107) extending outward of the film forming vessel 102, 103, and grounded by grounding means not shown. These guard electrodes 126 to 128 serve to prevent the discharge energy or produced plasma from leaking therefrom.

Next, the operation of this deposited film forming apparatus 100 will be described below.

First, the strip-like substrate 104 is extended from the substrate delivery vessel (not shown) connected to the gas gate on the inlet side to the substrate winding vessel (not shown) connected to the gas gate 130 on the outlet side so as to penetrate through the deposited film forming apparatus 100, and the vacuum vessel 101 and each film forming vessel 102, 103 are evacuated to a vacuum through the exhaust tubes 116, 118, 139. If a determined degree of vacuum is reached, a gate gas is supplied from each gate gas supply tube 135, 136 to each gas gate 129, 130. The gate gas is exhausted mainly through the exhaust tube 139 connected to the vacuum vessel 101.

Subsequently, the strip-like substrate 104 is heated to a predetermined temperature by activating the infrared lamp heaters 124, while monitoring the output of the thermocouple 137. And a source gas is supplied from each source gas supply tube 131, 132 to each of the first and second gas discharger 114, 115, which then discharges the source gas into each film forming vessel 102, 103. The source gas supplied to each gas discharger 114, 115 contains a plurality of kinds of deposited film source materials. A microwave energy is applied via each waveguide 111 to 113 to each applicator 105 to 107.

Furthermore, substrate delivery means (not shown) provided within the substrate delivery vessel (not shown) and substrate winding means (not shown) provided within the substrate winding vessel (not shown) are activated to move continuously the strip-like substrate 104 from the substrate delivery vessel toward the substrate winding vessel.

In this way, in a space of the first film forming vessel 102 between the strip-like substrate 104 and the first and second applicators 105, 106 (a first film forming space 133), the source gas flows from the first gas discharger 114 toward the exhaust tube 116, that is, in a direction opposite to the moving direction of the strip-like substrate 104. Further, because the microwave power is applied to the first and second applicators 105, 106, a microwave glow discharge is excited within the first film forming space 133 to produce a plasma, and the source gas is decomposed by the plasma so that a deposited film is formed on the strip-like substrate 104. At this time, the forming conditions of the deposited film may vary depending on the position of the strip-like substrate 104 in the moving direction thereof, because the source gas flows in a direction opposite to the moving direction of the strip-like substrate 104, and the source gas contains a plurality of kinds of deposited film source materials, so that the deposited film formed on the continuously moving strip-like substrate 104 can have a distribution of composition in a direction of film thickness. By controlling the microwave power to be applied to the first and second applicators 105, 106, the composition distribution of the deposited film in the direction of film thickness can be formed more effectively. Note that due to the provision of guard electrodes 126, 128, no leakage of the microwave energy or plasma from the first film forming vessel 102 occurs.

In the second film forming vessel 103, like in the first film forming vessel 102, a source gas is supplied to the second gas discharger 115, but the source gas discharged from the second gas discharger flows in a direction equivalent to the moving direction of the substrate toward the exhaust tube 117, unlike in the first film forming vessel 102.

By applying a microwave power to the third applicator 107, a plasma is-generated in a space between the strip-like substrate 104 and the third applicator 107 (a second film forming space 134), so that a deposited film is formed on the strip-like substrate 104. This deposited film has a distribution of composition in the direction of film thickness.

Since the strip-like substrate 104 is continuously moved from the first film forming vessel 102 toward the second film forming vessel 103, a deposited film formed in the second film forming vessel 103 is laminated on the deposited film formed in the first film forming vessel 102. Each portion of the deposited film formed in each film forming vessel 102, 103 has a distribution of composition-in the direction of film thickness, so that the entire deposited film has also a distribution of composition in the direction of film thickness.

The distribution of composition in the direction of film thickness can be changed abruptly by flowing the source gas in a forward direction equivalent to the moving direction of the substrate and in a reverse direction opposite thereto.

Figure 2:
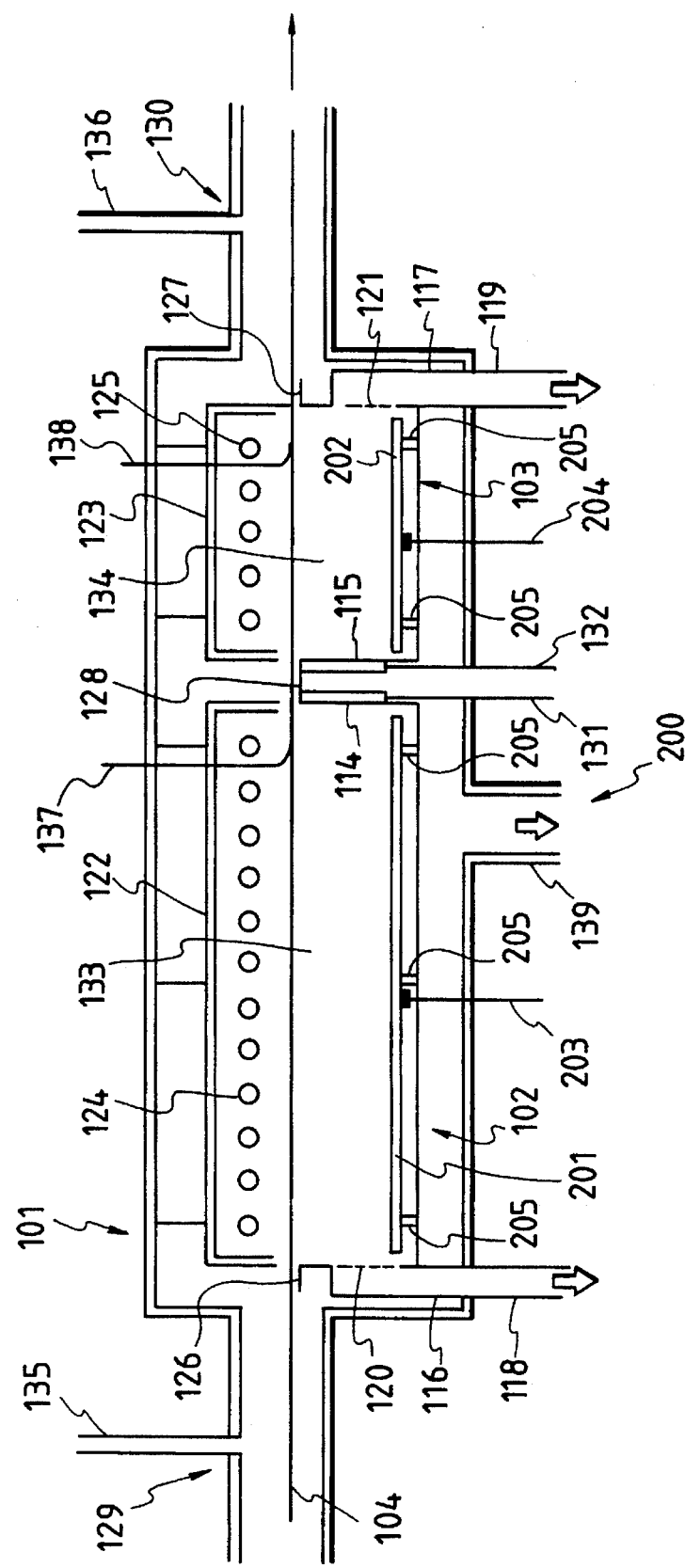
FIG. 2 is a schematic cross-sectional view showing the constitution of another deposited film forming apparatus for use in carrying out the deposited film forming method according to the embodiment of the present invention.

Next, a deposited film forming apparatus 200, apart from the deposited film forming apparatus 100 as above described, for use in carrying out a deposited film forming method of the present invention as shown in FIG. 2 will be described below. This deposited film forming apparatus 200 is to excite the plasma by high frequency electric power, in which first and second cathodes 201, 202 are provided instead of the applicators 105 to 107 for the deposited film forming apparatus 100 as shown in FIG. 1. This deposited film forming apparatus 200 will be described below based on the differences from the deposited film forming apparatus 100 as shown in FIG. 1.

A first cathode 201 is mounted via an insulating porcelain 205 within the first film forming vessel 102 so as to be opposed to the strip-like substrate 104, and connected via a high frequency lead wire 203 to one end of a high frequency power source not shown with the other end grounded therein. On the other hand, a second cathode 202, like the first cathode 201, is mounted via the insulating porcelain 205 within the second film forming vessel 103, and connected via a high frequency lead wire 204 to one end of the high frequency power source not shown with the other end grounded therein.

Next, the operation of this deposited film forming apparatus 200 will be described below.

Like the deposited film forming apparatus 100 as shown in FIG. 1, if a high frequency power is applied to the first and second cathodes 201, 202 while source gases are discharged from the first and second gas dischargers 114, 115 into the first and second film forming vessels 102, 103, respectively, and the strip-like substrate 104 is continuously moved in its longitudinal direction, a high frequency glow discharge is excited within each of the first and second film forming spaces 133, 134, generating a plasma, so that the deposited film is formed on the strip-like substrate 104. At this time, the source gas flows in the forward and reverse directions parallel to the moving direction of the strip-like substrate 104 within each film forming space 133, 134, whereby the film forming conditions can vary depending on the position of the strip-like substrate 104 in the moving direction thereof, so that the deposited film formed has a distribution of composition in the direction of film thickness.

Next, a continuous deposited film forming apparatus 300 with the deposited film forming apparatus 100 as shown in FIG. 1 incorporated therein will be described with reference to FIG. 3.

This continuous deposited film forming apparatus 300 is suitable for forming a semiconductor element having the pin junction on the strip-like substrate 104, in which a substrate delivery vessel 301, a first impurity layer forming vacuum vessel 302, the deposited film forming apparatus 100, a second impurity layer forming vacuum vessel 303, and a substrate winding vessel 304 are connected in series via four gas gates 311, 129, 130 and 312. Those gas gates 311, 129, 130, 312 are coupled with gate gas supply tubes 313, 135, 136, 314 for the supply of gate gas, respectively.

The substrate delivery vessel 301 serves store and deliver the strip-like substrate 104 to the substrate winding vessel 304, and has a bobbin 321 mounted therein around which the strip-like substrate 104 is wound. Also, the substrate dilevery vessel 301 has an exhaust tube 322 attached therto which is connected to exhausting means not shown, and has a throttle valve 323 provided halfway thereof for controlling the pressure within the substrate delivery vessel 301. Furthermore, the substrate delivery vessel 302 is provided with a pressure gauge 324, a heater 325 for heating the strip-like substrate 104, and a conveying roller 326 for supporting and conveying the strip-like substrate 104. Note that the bobbin 321 is connected to a substrate delivery mechanism not shown for delivering the strip-like substrate 104.

The first and second impurity layer forming vacuum vessels 302, 303 have the identical structure to form a p-type or n-type semiconductor layer. Each impurity layer forming vacuum vessel 302, 303 is coupled with an exhaust-tube 330 connected to exhausting means not shown, and halfway of the exhaust tube 330, there {s provided a throttle valve 331 for controlling the internal pressure of the impurity layer forming vacuum vessels 302, 303. The strip-like substrate 104 is supported by two conveying rollers 332, with the end portions thereof in its width direction supported by support rings 333, so as to be movable along the lateral surface of a substantially cylindrical space within each of the impurity layer forming vacuum vessels 302, 303. And a source gas introducing conduit 334 is provided in a central portion of the cylindrical space, and an applicator 335 for introducing the microwave into this cylindrical space at a portion corresponding to a top face of the cylindrical space. This applicator 335 is connected to a microwave power source not shown. Further, a heater 336 for heating the strip-like substrate 104 is provided within each of the impurity layer forming vacuum vessels 302, 303.

The substrate winding vessel 304 serves to wind the strip-like substrate 104 on which the deposited film is formed, and has a constitution identical to that of the substrate delivery vessel 301, except that a bobbin 321 is connected to a substrate winding mechanism not shown for winding the strip-like substrate 104.

Next, the operation of the continuous deposited film forming apparatus 300 will be described below mainly when forming a semiconductor element having the pin junction.

First, the strip-like substrate 104 is extended from the substrate delivery vessel 301 to the substrate winding vessel 304. Subsequently, the substrate delivery vessel 301, each impurity layer forming vacuum vessels 302, 303, the deposited film forming apparatus 100 and the substrate winding vessel 304 are evacuated, and if they have reached to a determined degree of vacuum, the gate gas is supplied to each of the gas gates 311, 129, 130 and 312.

Then, a source gas for forming a p- or n-type semiconductor layer is supplied to each of the impurity layer forming vacuum vessels 302, 303, a source gas for forming an i-type semiconductor layer is supplied to the deposited film forming apparatus 100, and further a microwave power is supplied to each of the impurity layer forming vacuum vessels 302, 303 and the deposited film forming apparatus 100, whereby a plasma is excited within each of the impurity layer forming vacuum vessels 302, 303 and the deposited film forming apparatus 100 by starting the movement of the strip-like substrate 104 from the substrate delivery vessel 301 toward the substrate winding vessel 304, so that deposited film is formed on the strip-like substrate 104. Since the strip-like substrate 104 is moved continuously along with the first impurity layer forming vacuum vessel 302, the deposited film forming apparatus 100 and the second impurity layer forming vacuum vessel 303, a semiconductor element having the pin junction is formed on the strip-like substrate 104. In this case, the deposited film forming apparatus 100 allows the deposited film to have a distribution of composition in a direction of film thickness, as above described, whereby in the semiconductor element formed, for example, the band gap or fermi level can be changed in the direction of film thickness for the i-type semiconductor layer.

Next, a continuous deposited film forming apparatus 350 with the deposited film forming apparatus 100 as shown in FIG. 2 incorporated therein will be described with reference to FIG. 4.

Figure 3:
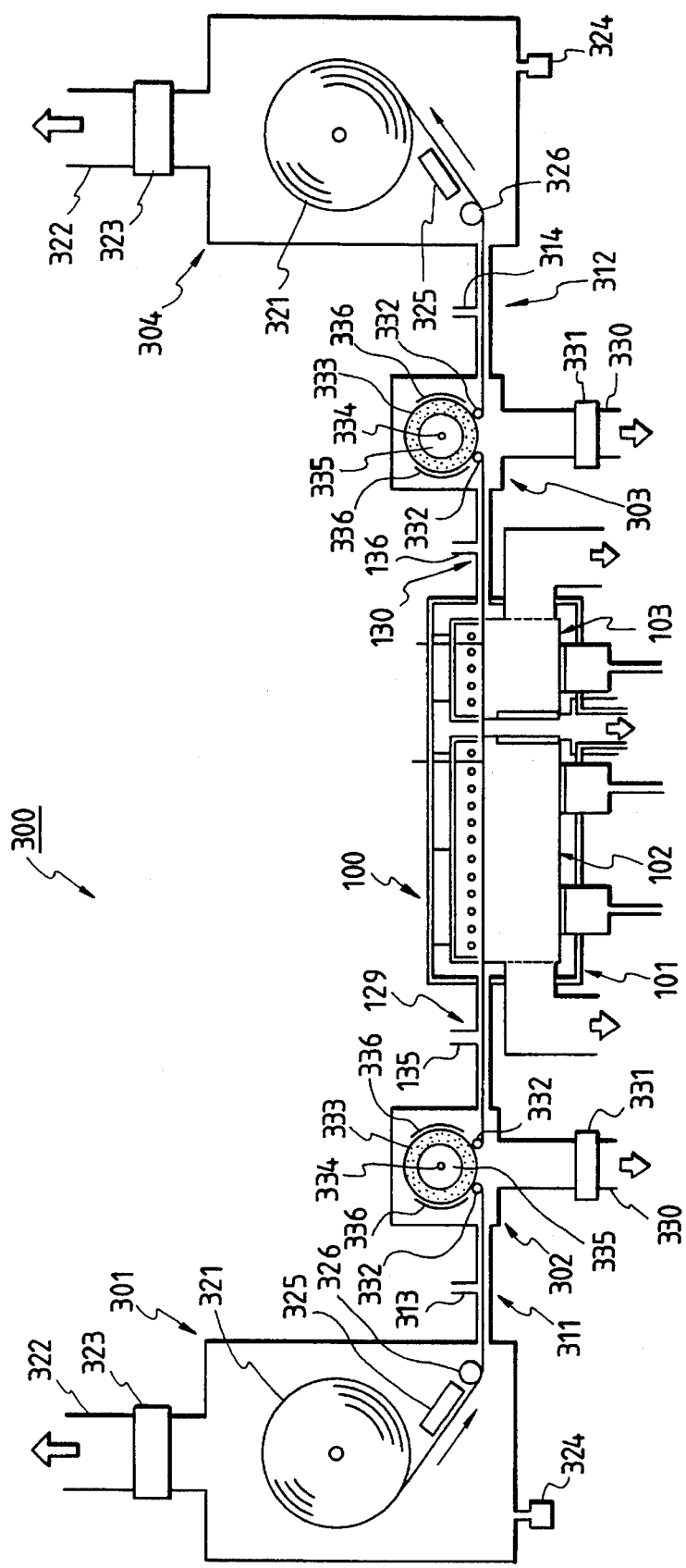
FIG. 3 is a schematic cross-sectional view showing the constitution of a continuous deposited film forming apparatus having incorporated the deposited film forming apparatus as shown in FIG. 1.

This continuous deposited film forming apparatus 350 is suitable for forming a semiconductor element having the pin junction on the strip-like substrate 104, in which instead of providing the first and second impurity layer forming vacuum vessels 302, 303, and the deposited film forming apparatus 100 in the continuous deposited film forming apparatus 300 as described in FIG. 3, first and second impurity layer forming vacuum vessels 351, 352 and the deposited film forming apparatus 200 as shown in FIG. 2 which can generate a plasma by high frequency are used. Since the deposited film forming apparatus 200 as shown in FIG. 2 has been described in FIG. 2, the impurity layer forming vacuum vessels 351, 352 which produce the plasma by high frequency in this continuous deposited film forming apparatus 350 will be described below.

The first and second impurity layer forming vacuum vessels 351, 352 have the identical constitution, in which there is provided with a film forming vessel 361 for restricting the region of exciting the high frequency glow discharge inside thereof, so that the strip-like substrate 104 penetrates movably through this film forming vessel 361. Within the film forming vessel 361, a cathode 362 is provided opposed to the strip-like substrate 104, and can be heated by a heater 363. Also, the cathode 362 is connected via a high frequency lead wire 364 to a high frequency power source not shown. In a space between the cathode 362 and the strip-like substrate 104 is provided a source gas introducing tube 366. Furthermore, a heater 365 for heating the strip-like substrate 104 is provided on the opposite hand to the cathode 362 with respect to the strip-like substrate 104. Each impurity layer forming vacuum vessel 351, 352 is coupled with an exhaust tube 361 connected to exhausting means not shown.

Next, the operation of the continuous deposited film forming apparatus 350 will be described below mainly in forming a semiconductor element having the pin junction.

First, as in the continuous deposited film forming apparatus 300 as described in FIG. 3, the strip-like substrate 104 is extended from the substrate delivery vessel 301 to the substrate winding vessel 304. Subsequently, the substrate delivery vessel 301, each impurity layer forming vacuum vessel 351, 352, the deposited film forming apparatus 200 and the substrate winding vessel 304 are evacuated, and if they have reached a determined degree of vacuum, the gate gas is supplied to each of the gas gates 311, 129, 130 and 312.

Then, a source gas for forming a p- or n-type semiconductor layer is supplied to each of the impurity layer forming vacuum vessels 351, 352, a source gas for forming an i-type semiconductor layer is supplied to the deposited film forming apparatus 200, and further a high frequency power is supplied to each of the impurity layer forming vacuum vessels 351, 352 and the deposited film forming apparatus 200, whereby a plasma is excited within each of the impurity layer forming vacuum vessels 351, 352 and the deposited film forming apparatus 200 by starting the movement of the strip-like substrate 104 from the substrate delivery vessel 301 toward the substrate winding vessel 304, so that deposited film is formed on the strip-like substrate 104. Since the strip-like substrate 104 is moved continuously along with the first impurity layer forming vacuum vessel 351, the deposited film forming apparatus 200 and the second impurity layer forming vacuum vessel 352, a semiconductor element having the pin junction is formed on the strip-like substrate 104. In this case, the deposited film forming apparatus 200 allows the deposited film to have a distribution of composition in a direction of film thickness, as above described, whereby in the semiconductor element formed, for example, the band gap or fermi level can be changed in the direction of film thickness for the i-type semiconductor layer.

Next, the experimental results conducted with this embodiment will be presented by showing specific numerical values. Note that the experimental example as set forth herein is one in which the deposited film forming method of this embodiment has been applied to the formation of an amorphous silicon type solar cell or an amorphous silicon semiconductor film which is a constituent of this solar cell. The amorphous silicon type solar cell will be first described using FIGS. 5A to 5D.

Figure 5A:
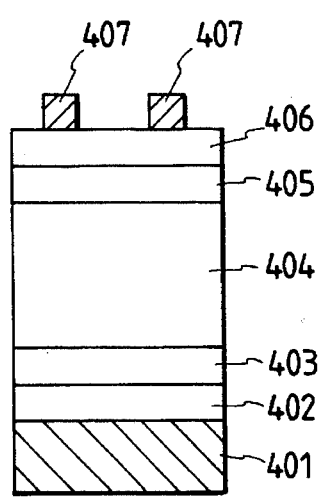
FIGS. 5A to 5D are schematic cross-sectional views showing the constitutions of solar cell.

A solar cell as shown in FIG. 5A has a structure in which an under electrode 402, an n-type semiconductor layer 403, an i-type semiconductor layer 404, a p-type semiconductor layer 405, and a transparent electrode 406 are laminated sequentially on a substrate 401, and further a lattice-like collector electrode 407 is formed on the transparent electrode 406. In this solar cell, it is presumed that light is incident from the side of the transparent electrode 406. The under electrode 402 is an electrode opposed to the transparent electrode 406 with the semiconductor layers 403 to 405 interposed therebetween.

Figure 5B:
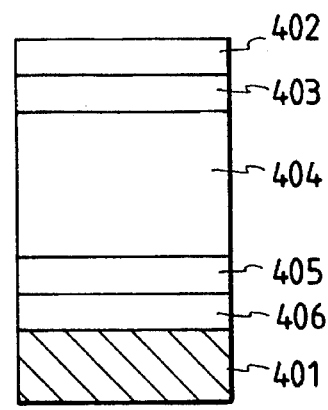

A solar cell as shown in FIG. 5B has a transparent substrate 401 on which light is incident from the side of this substrate 401, in which a transparent electrode 406, a p-type semiconductor layer 405, an i-type semiconductor layer 404, an n-type semiconductor layer 403, and an under electrode 402 are laminated sequentially on the substrate 401.

Figure 5C:
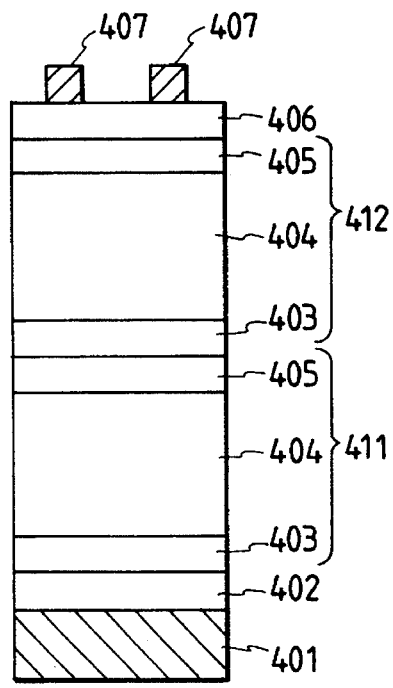

Each solar cell as above described has a single pin junction, but two pin junctions may be laminated to improve the utilization efficiency of the incident light. FIG. 5C shows a constitution of a solar cell (a so-called tandem-type solar cell) having two pin junctions, in which an under electrode 402, a first pin junction 411, a second pin junction 412, a transparent electrode 406 and a collector electrode 407 are laminated sequentially on the substrate 401. Light is incident from the side of the transparent electrode 406. Each pin junction 411, 412, of course, has a structure in which an n-type semiconductor layer 403, an i-type semiconductor layer 404 and a p-type semiconductor layer 405 are laminated, and in which the i-type semiconductor layer 404 can have different band gaps or film thicknesses in the first and second pin junctions 411, 412 to improve the photoelectric conversion efficiency.

Figure 5D:
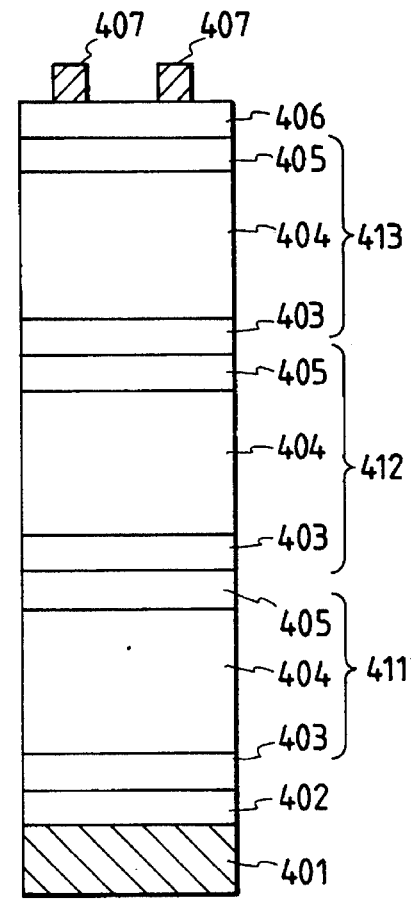

Furthermore, three pin junctions are laminated to improve the photoelectric conversion efficiency. FIG. 5D shows a constitution of a solar cell having three pin junctions (a so-called triple-type solar cell), in which an under electrode 402, a first pin junction 411, a second pin junction 412, a third pin junction 413, a transparent electrode 406, and a collector electrode 407 are laminated sequentially on the substrate 401. Light is incident from the side of the transparent electrode 406. Also in this solar cell, to improve the photoelectric conversion efficiency, the i-type semiconductor layer 404 can have different band gaps or film thicknesses in the pin junctions 411 to 413.

Next, the details for each component of the solar cell as above described will be described below. While in each solar cell as shown in FIGS. 5A to 5D, the p-type semiconductor layer 405 is located closer to the light incident side than the n-type semiconductor layer 403, it is also possible that the n-type semiconductor layer 403 may be located closer to the light incident side in the layer constitution.

First, the substrate 401 will be described below.

The substrate 401 for use in this solar cell is suitably made of a flexible material capable of forming a curved shape, which may be electrically conductive or insulating. The substrate 401 may or may not be transparent, but when light is incident from the side of the substrate 401, the substrate 401 is of course necessary to be transparent. Specifically, in this embodiment, the strip-like substrate 104 as above described can be cited. The use of the strip-like substrate 401 can realize the lighter weight, the improvement of the strength, and the reduction of transportation space for the solar cell.

The electrode for deriving the power from the solar cell will be described below.

In this solar cell, an appropriate electrode can be used depending on the constitution or form thereof. Examples of the electrode include the under electrode 402, the transparent electrode 406, and the collector electrode 407. (Note-that the transparent electrode 406 referred to herein is one provided on the incident side of the light, while the under electrode 402 is one provided opposed to the transparent electrode 406 with semiconductor layers 403 to 405 interposed therebetween.)

These electrodes will be described in detail.

(i) Under electrode 402

The installing site of the under electrode 402 is unfixed, because the plane irradiated by the light for generation of photovoltaic power is different depending on whether or not the substrate 401 is made of a transparent material (for example, when the substrate 401 is made of a non-transparent material such as a metal, light is incident from the side of the transparent electrode 406 as shown in FIG. 5A).

Specifically, in the layer constitution as shown in FIGS. 5A, 5C and 5D, the under electrode 402 is provided as the electrode for deriving the current between the substrate 401 and the n-type semiconductor layer 403. Note that when the substrate 401 is electrically conductive, the substrate 401 can be also used as the under electrode 402, so that the under electrode 402 can be omitted. However, when the substrate 401 has a high sheet resistance value even though being electrically conductive, the under electrode may be installed as a low resistive electrode for deriving the current or to make the effective use of the incident light by increasing the reflectance at the plane of support member.

In FIG. 5B, a transparent substrate 401 is used, with light being incident from the side of the substrate 401, so that the under electrode 402 is provided opposed to the substrate 401 with the semiconductor layers 403 to 405 interposed therebetween for the purpose of deriving the current or reflecting the light.

Examples of the material for the under electrode 402 include a metal such as Ag, Au, Pt, Ni, Cr, Cu, Al, Ti, Zn, Mo, W, or an alloy thereof, in which a thin film of the metal is formed by vacuum deposition, electron beam vapor deposition or sputtering. And a care must be taken so that the formed thin film may not be a resistive component to the output of the solar cell, and the sheet resistance value of the under electrode 402 is preferably 50Ω or less, and more preferably 100Ω or less.

Between the under electrode 402 and the n-type semiconductor layer 403, a diffusion preventing layer (not shown) such as a conductive zinc oxide may be provided. The effect of this diffusion preventing layer is not only to prevent a metal element constituting the under electrode 402 from diffusing into the n-type semiconductor layer 403, but also to prevent short-circuit between the under electrode 402 and the transparent electrode 406 due to defects such as pinholes arising in each semiconductor layer 403 to 405, by virtue of some resistance provided, or to confine the incident light within the solar cell by causing multiple interference with the thin film, for example.

(ii) Transparent electrode 406

The transparent electrode 406 has desirably a light transmittance of 85% or greater in order to absorb the light from the sun or a white fluorescent lamp into each semiconductor layer 403 to 405 efficiently, and electrically a sheet resistance of 100Ω or less not to be a resistive component to the output of the solar cell. Examples of the material having such characteristics include a metallic oxide such as $SnO_2$, $In_2O_3$, ZnO, CdO, $Cd_2SnO_4$, ITO ($In_2O_3+SnO_2$), and a metallic thin film having a metal such as Au, Al, Cu formed as a very thin and translucent film. The transparent electrode is laminated on the p-type semiconductor layer 405 in the solar cell as shown in FIGS. 5A, 5C and 5D, while it is laminated on the substrate 401 in the solar cell as shown in FIG. 5B, whereby it is necessary to select the material having an excellent mutual adherence. The fabrication method of the transparent electrode 406 may be any one of resistance heating vapor deposition, electron beam heating vapor deposition, sputtering, and spraying method, which can be appropriately selected as desired.

(iii) Collector electrode 407

The collector electrode 407 is provided as a lattice on the transparent electrode 406 to reduce the surface resistance of the transparent electrode 406 effectively. The material of the collector electrode 407 may be a metal such as Ag, Cr, Ni, Al, Ag, Au, Ti, Pt, Cu, Mo, W, or an alloy thereof, which is formed as a thin film. Such a thin film can be used by laminating. Also, the shape and area of the thin film is appropriately designed such that the quantity of light incident upon each semiconductor layer 403 to 405 can be sufficiently obtained.

For example, the shape thereof is desirably such that the thin film extends uniformly over the light receiving face of the solar cell, and the area thereof is preferably 15% or less of the light receiving area, and more preferably 10% or less. The sheet resistance is preferably 50Ω or less, and more preferably 10Ω or less.

Next, the n-type semiconductor layer 403, the i-type semiconductor layer 404 and the p-type semiconductor layer 405 will be described below.

(i) i-type semiconductor layer 404

Examples of the semiconductor material constituting the i-type semiconductor layer 404 include IV-group semiconductor materials such as a-Si:H, a-Si:F, a-Si:H:F, a-SiC:K, a-SiC:F, a-SiC:H:F, a-SiGe:H, a-SiGe:F, a-SiGe:H:F, poly-Si:H, poly-Si:F, poly-Si:H:F, and IV-group alloy-type semiconductor materials. Additional examples thereof include II-VI-group compound semiconductor materials and III-V-group compound semiconductor materials.

The i-type semiconductor layer 404 can have varying composition in a direction of film thickness, thereby varying band gap, in order to improve the photoelectric conversion efficiency. FIGS. 6A to 6D show specific examples of how the band gap $E_c$: conduction band, $E_v$: valence band is changed in the i-type semiconductor layer 404 (band gap profile). The arrow → in the figure indicates the incident side of the light.

Figure 6A:
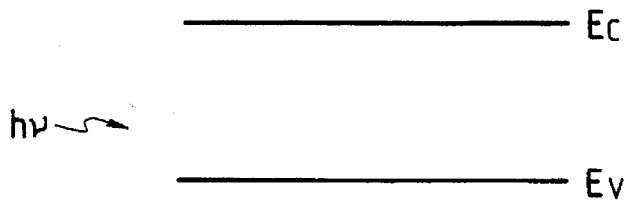
FIGS. 6A to 6D are explanation views showing the band gap profiles of i-type semiconductor layer.
Figure 6B:
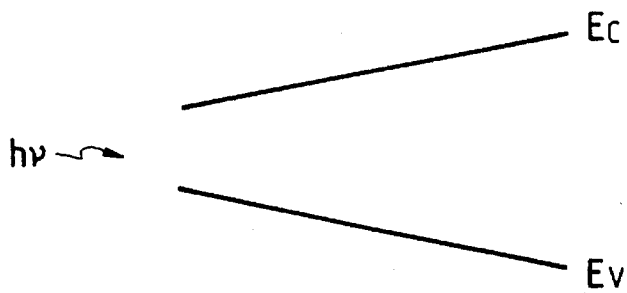
Figure 6C:
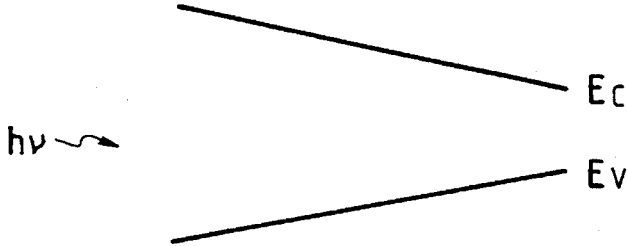
Figure 6D:
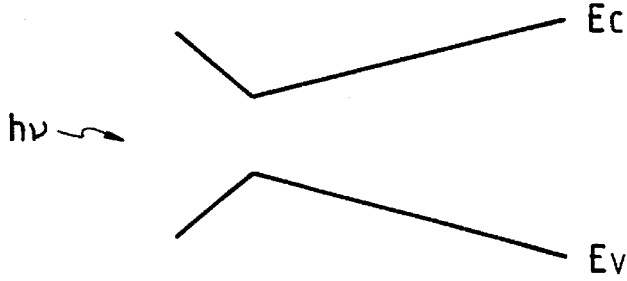

The band gap profile as shown in FIG. 6A represents a constant band gap in the i-type semiconductor layer 404. The band gap profile as shown in FIG. 6B represents a band gap of the type which is narrower on the incident side of the light, and gradually widening in the i-type semiconductor layer 404. By making the shape of the band gap in the above way, there is provided the effect for improving the curve factor (Fill Factor: FF). The band gap profile as shown in FIG. 6C represents a band gap of the type which is wider on the incident side of the light, and gradually narrowing, whereby there is provided the effect for improving the open voltage ($V_{oc}$). The band gap profile as shown in FIG. 6D represents a band gap of the type which is wider on the incident side of the light, and gets narrow relatively steeply, and again wider, whereby the combinational effects of FIGS. 6B and 6C can be obtained simultaneously. In order to provide the change in the band gap as above described, it suffices to combine different semiconductors. For example, a combination of a-Si:H ($E_g^{opt}$=1.72 eV) and a-SiGe:H ($E_g^{opt}$=1.45 eV) makes it possible to fabricate the i-type semiconductor layer 404 having a band gap profile as shown in FIG. 6D. In addition, a combination of a-SiCuiH ($E_g^{opt}$=2.05 eV) and a-Si:H ($E_g^{opt}$=1.72 eV) makes it possible to fabricate the i-type semiconductor layer 404 having a band gap profile as shown in FIG. 6C.

Also, by changing the density of impurity added by a minute amount to the i-type semiconductor layer 404 in a direction of film thickness, the i-type semiconductor layer 404 can have a change at the fermi level $E_F$ with the conductive type maintained in the i-type. FIGS. 7A to 7D show specific examples of how the fermi level $E_F$ in the i-type semiconductor layer 404 having a band gap as shown in FIG. 6A (i.e., a constant band gap) is changed (fermi level profile). The arrow → in the figure indicates the incident side of the light.

Figure 7A:
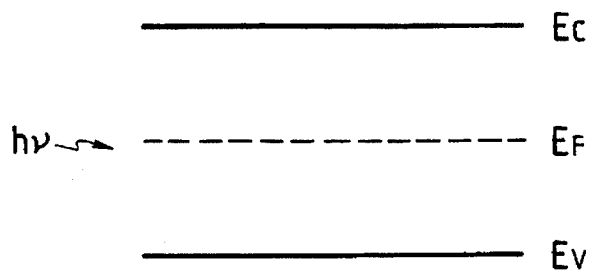
FIGS. 7A to 7D are explanation views showing the fermi level profiles of i-type semiconductor layer.
Figure 7B:
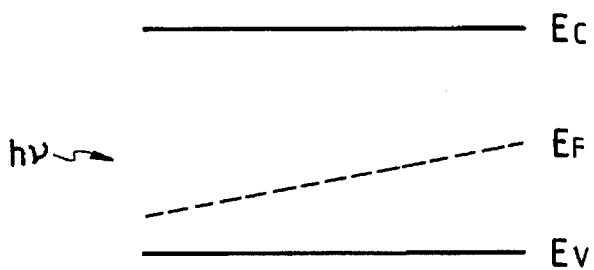
Figure 7C:
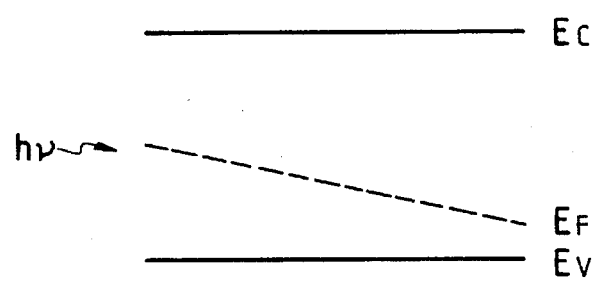
Figure 7D:
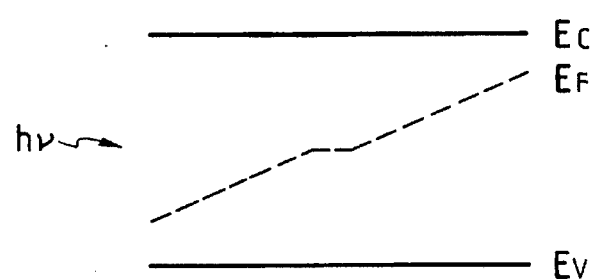

FIG. 7A shows a fermi level profile of the i-type semiconductor layer 404 without the addition of impurities. On the contrary, FIG. 7B shows a fermi level profile of the type which is closer to the valence band $E_v$ on the incident side of the light, gradually approaching to the conduction band $E_c$, whereby there is provided the effect for preventing the recombination of light produced carriers and raising the traveling property of carriers. FIG. 7C shows a fermi level $E_F$ profile of the type which gradually approaches to the valence band $E_v$ from the incident side of the light, whereby there is provided the same effect as in FIG. 7B when the n-type semiconductor layer is provided on the incident side of the light. FIG. 7D shows a fermi level $E_F$ profile of the type which changes continuously from the valence band $E_v$ on the incident side of the light toward the conduction band. These exemplify an instance of the constant band gap, but in the band gap profile as shown in FIGS. 6B to 6D, the fermi level can be controlled in the same way.

By appropriately designing the band gap profile and the fermi level profile, the solar cell having a high photoelectric conversion efficiency can be fabricated. In particular, the band gap profile and the fermi level profile is desirably controlled for the i-type semiconductor layer 404, as shown in FIGS. 5C and 5D, in the solar cell of the so-called tandem or triple type.

(ii) p-type semiconductor layer 405 and n-type semiconductor layer 403

The p-type semiconductor layer 405 or the n-type semiconductor layer 403 can be obtained by doping a valence electron control agent into the semiconductor material constituting the i-type semiconductor layer 404 as previously described, by a well known method.

(Experimental example 1)

Using a deposited film forming apparatus 100 as shown in FIG. 1, a substrate delivery vessel (not shown) and a substrate winding vessel (not shown) were coupled with a gas gate 129 on the inlet side and a gas gate 130 on the outlet side, respectively. The substrate delivery vessel (not shown) and the substrate winding vessel were provided with a substrate delivery mechanism (not shown) for delivering a strip-like substrate 104 and a substrate winding mechanism (not shown) for winding the strip-like substrate 104, respectively.

First, the strip-like substrate-104 (40 cm wide×20 m long×0.125 mm thick) made of stainless (SUS304BA) was sufficiently degreased and cleaned. A bobbin (not shown) having the strip-like substrate 104 wound therearound was loaded into the substrate delivery vessel, and the strip-like substrate 104 was passed through the gas gate on the inlet side, first and second film forming vessels 102, 103, and the gas gate on the outlet side to the substrate winding vessel, and the tension adjustment was made so that the strip-like substrate was not loosened. And the substrate delivery vessel (not shown), a vacuum vessel 101, film forming vessels 102, 103, and the substrate winding vessel (not shown) were roughly evacuated by a mechanical booster pump/rotary pump, not shown, and then to a high vacuum of $5 \times 10^{-6}$ Torr or less by an oil diffusion pump (not shown). Then, each infrared lamp heater 124, 125 was lighted, and the temperature control was made by monitoring the output of each thermocouple 136, 137 so that the surface temperature of the strip-like substrate 104 was at 300° C., whereby the heating and degasification were performed.

After being sufficiently degasified, under the conditions as indicated in Table 1, a source gas for the formation of deposited film was introduced from each gas discharger 114, 115 into each film forming vessel-102, 103 by activating the oil diffusion pump (not shown) connected to each exhaust tube 116, 117. At the same time, a gate gas of $H_2$ gas having a flow of 300 sccm was supplied from each gate gas supply tube 135, 136 into each gas gate 129, 130, and then this gate gas was exhausted through an exhaust tube 138 directly coupled with the vacuum vessel 101, the substrate delivery vessel (not shown) and the substrate winding vessel (not shown). In this state, the pressure within the first and second film forming vessels 102, 103 was held at 8 mTorr and 6 mTorr, respectively.

TABLE 1

| Kind and flow of source gas | First gas discharger 114 | |
|---|---|---|
| | $SiH_4$: | 320 sccm |
| | $GeH_4$: | 160 sccm |
| | $H_2$: | 200 sccm |
| | Second gas discharger 115 | |
| | $SiH_4$: | 150 sccm |
| | $GeH_4$: | 70 sccm |
| | $H_2$: | 80 sccm |
| Microwave power | First applicator 105 | 450 W |
| | Second applicator 106 | 550 W |
| | Third applicator 107 | 350 W |
| Length of film forming region | First film forming vessel 102 | 48 cm |
| | Second film forming vessel 103 | 22 cm |
| Temperature of strip-like substrate 104 | First film forming vessel 102 | 300° C. |
| | Second film forming vessel 103 | 290° C. |

When the pressure within each film forming vessel 102, 103 was stabilized, a microwave having a frequency of 2.45 GHz was introduced via each waveguide 111 to 113 and each applicator 105 to 107 into each film forming vessel 102, 103 by a microwave power source not shown. As a result, a microwave glow discharge was excited within each film forming space 133, 134, and a plasma was generated, but no leakage of microwave and plasma through a portion of each guard electrode 126 to 128 was found. The size of a microwave glow discharge region within each film forming vessel 102, 103 may vary depending on the power of incident microwave or the kind and flow of the source gas, whereby the size of this region was visually observed and obtained as the length of the strip-like substrate 104 over a moving direction thereof. Its results were indicated in the column of film forming region length in Table 1.

Then, the movement of the strip-like substrate 104 was started in a direction from the substrate delivery vessel (not shown) to the substrate winding vessel (not shown), that is, in a direction of the arrow was shown in FIG. 1. The moving speed at this time was 100 cm/min. A deposited film made of i-type a-SiGe:H was formed on the strip-like substrate 104 while the strip-like substrate 104 was continuously moved for ten minutes.

Note that since the strip-like substrate 104 was so long that the length was 200 m, after this experimental example 1, experimental examples 2 to 4 as thereafter described were carried out consecutively with the strip-like substrate 104 on the deposited film forming apparatus 100, so that deposited films formed in experimental examples 1 to 4 appeared on the same strip-like substrate 104 sequentially in its moving direction. After the formation of all deposited films in the experimental examples 1 to 4 was terminated, the strip-like substrate 104 was cooled and taken out from the deposited film forming apparatus 100.

The measurement of film thickness distribution for the deposited film formed in this experimental example 1 indicated that the dispersion of the film thickness was within 5% in both the width direction and the longitudinal direction of the strip-like substrate 104. The calculated forming speed of deposited film was 95 Å/sec in average.

Figure 8:
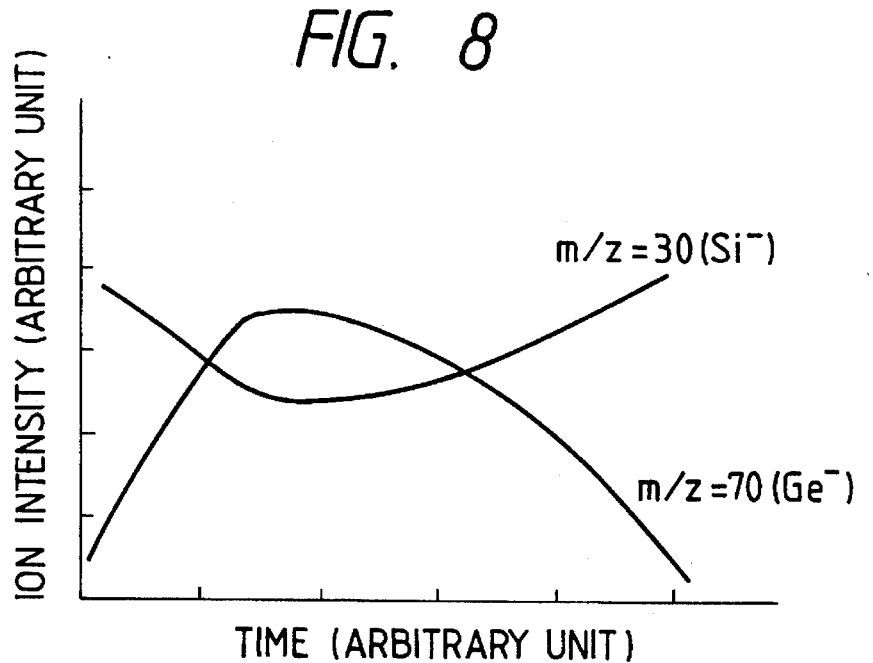
FIGS. 8 to 11 are characteristic views showing the results of secondary ion mass spectrometry.

Then, a portion of the strip-like substrate 104 on which deposited film made of a-SiGe:H was formed in the experimental example 1 was selectively cut out at arbitrary six positions, and the distribution of element in a depth direction was measured using a secondary ion mass spectrometer (SIMS) (manufactured by CAMECA, imf-3 type). As a result, the distribution of element in the depth direction as shown in FIG. 8 was obtained, and it could be found that the same band gap profile as that shown in FIG. 6D was provided. Also, the determination of all hydrogen contained in the deposited film using a metal hydrogen analyzer (manufactured by Horiba, EMGA-1100 type) indicated 16±2 atomic percent. Note that the transversal axis in FIG. 8 represents the time, but since the elapsed time is proportional to the depth in the secondary ion mass spectrometry, the transversal axis in FIG. 8 can be considered to represent the depth from the surface.

(Experimental example 2)

After the formation of the deposited film was terminated in the experimental example 1, the introduction of the source gas for the formation of deposited film and the gate gas was stopped and the first and second film forming vessels 102, 103 were evacuated to $5 \times 10^{-6}$ Torr, respectively. Subsequently, like in the experimental example 1, the gate gas was supplied and a deposited film of i-type a-SiC:H was continuously formed on the strip-like substrate 104 under the conditions as indicated in Table 2. In this case, the moving speed of the strip-like substrate 104 was 95 cm/min. Also, the internal pressures of the first and second film forming vessels 102, 103 were held at 14 mTorr and 12 mTorr, respectively, during the formation of the deposited film.

TABLE 2

| Kind and | First gas discharger 114 | |
|---|---|---|
| flow of source gas | $SiH_4$: | 340 sccm |
| | $CH_4$: | 20 sccm |
| | $H_2$: | 180 sccm |
| | Second gas discharger 115 | |
| | $SiH_4$: | 200 sccm |
| | $CH_4$: | 20 sccm |
| | $H_2$: | 100 sccm |
| Microwave power | First applicator 105 | 400 W |
| | Second applicator 106 | 450 W |
| | Third applicator 107 | 500 W |
| Length of film forming region | First film forming vessel 102 | 46 cm |
| | Second film forming vessel 103 | 20 cm |
| Temperature of strip-like substrate 104 | First film forming vessel 102 | 290° C. |
| | Second film forming vessel 103 | 300° C. |

As in the experimental example 1, after all the formation of deposited film in the experimental examples 1 to 4 was terminated, the measurement of film thickness distribution for the deposited film formed in this experimental example 2 indicated that the dispersion of the film thickness was within 5%, and the calculated forming speed of deposited film was 80 Å/sec in average.

Figure 9:
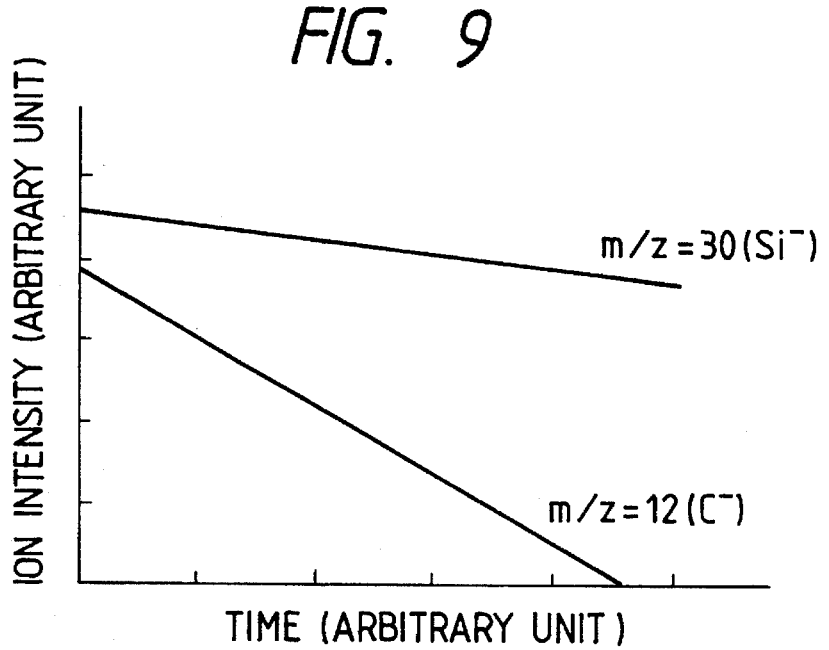

Then, as in the experimental example 1, a portion of the strip-like substrate 104 on which deposited film made of a-SiC:H was formed in the experimental example 2 was selectively cut out at arbitrary six positions, and the distribution of element in a depth direction was measured. As a result, the distribution of element in the depth direction as shown in FIG. 9 was obtained, and it could be found that the same band gap profile as that shown in FIG. 6C was provided. Also, the determination of all hydrogen contained in the deposited film indicated 14±2 atomic percent.

(Experimental example 3)

After the formation of the deposited film was terminated in the experimental examples 1 and 2, the introduction of the source gas for the formation of deposited film and the gate gas was stopped and the first and second film forming vessels 102, 103 were evacuated to $5 \times 10^{-6}$ Torr, respectively. Subsequently, like in the experimental example 1, the gate gas was supplied and a deposited film of a-Si:H containing B as impurities was continuously formed on the strip-like substrate 104 under the conditions as indicated in Table 3. In this case, the moving speed of the strip-like substrate 104 was 95 cm/min. Also, the internal pressures of the first and second film forming vessels 102, 103 were held at 4 mTorr and 5 mTorr, respectively, during the formation of the deposited film.

TABLE 3

| Kind and | First gas discharger 114 | |
|---|---|---|
| flow of source gas | $SiH_4$: | 500 sccm |
| | $H_2$: | 180 sccm |
| | $BF_3/H_2$ (50 ppm diluted): | 10 sccm |
| | Second gas discharger 115 | |
| | $SiH_4$: | 250 sccm |
| | $H_2$: | 100 sccm |
| | $BF_3/H_2$ (50 ppm diluted): | 5 sccm |
| Microwave power | First applicator 105 | 520 W |
| | Second applicator 106 | 480 W |
| | Third applicator 107 | 450 W |
| Length of film forming region | First film forming vessel 102 | 48 cm |
| | Second film forming vessel 103 | 22 cm |
| Temperature of strip-like substrate 104 | First film forming vessel 102 | 280° C. |
| | Second film forming vessel 103 | 290° C. |

As in the experimental example 1, after all the formation of deposited film in the experimental examples 1 to 4 was terminated, the measurement of film thickness distribution for the deposited film formed in this experimental example 3 indicated that the dispersion of the film thickness was within 5%, and the calculated forming speed of deposited film was 110 Å/sec in average.

Figure 10:
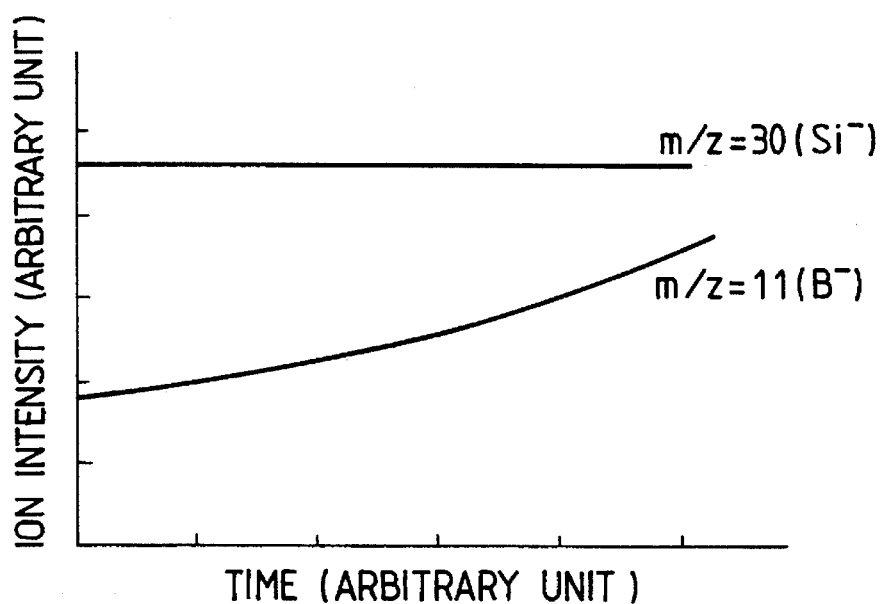

Then, as in the experimental example 1, a portion of the strip-like substrate on which deposited film made of a-Si:H was formed in the experimental example 3 was selectively cut out at arbitrary six positions, and the distribution of element in a depth direction was measured. As a result, the distribution of element in the depth direction as shown in FIG. 10 was obtained, and it could be found that the same fermi level profile as that shown in FIG. 7B was provided. Also, the determination of all hydrogen contained in the deposited film indicated 18±2 atomic percent.

(Experimental example 4)

After the formation of the deposited film was terminated in the experimental examples 1 to 3, the introduction of the source gas for the formation of deposited film and the gate gas was stopped and the first and second film forming vessels 102, 103 were evacuated to $5 \times 10^{-6}$ Torr, respectively. Subsequently, like in the experimental example 1, the gate gas was supplied and a deposited film of i-type a-SiGe:H was continuously formed on the strip-like substrate 104 under the conditions as indicated in Table 4. In this case, the moving speed of the strip-like substrate 104 was 95 cm/min. Also, the internal pressures of the first and second film forming vessels 102, 103 were held at 7 mTorr and 9 mTorr, respectively, during the formation of the deposited film.

TABLE 4

| Kind and | First gas discharger 114 | |
|---|---|---|
| flow of | SiH$_4$: | 340 sccm |
| source gas | GeH$_4$: | 120 sccm |
| | H$_2$: | 300 sccm |
| | Second gas discharger 115 | |
| | SiH$_4$: | 140 sccm |
| | GeH$_4$: | 75 sccm |
| | H$_2$: | 60 sccm |
| Microwave | First applicator 105 | 400 W |
| power | Second applicator 106 | 450 W |
| | Third applicator 107 | 500 W |
| Length of | First film forming vessel 102 | 48 cm |
| film forming region | Second film forming vessel 103 | 22 cm |
| Temperature | First film forming vessel 102 | 290° C. |
| of strip-like substrate 104 | Second film forming vessel 103 | 290° C. |

As in the experimental example 1, after all the formation of deposited film in the experimental examples 1 to 4 was terminated, the measurement of film thickness distribution for the deposited film formed in this experimental example 4 indicated that the dispersion of the film thickness was within 5%, and the calculated forming speed of deposited film was 95 Å/sec in average.

Figure 11:
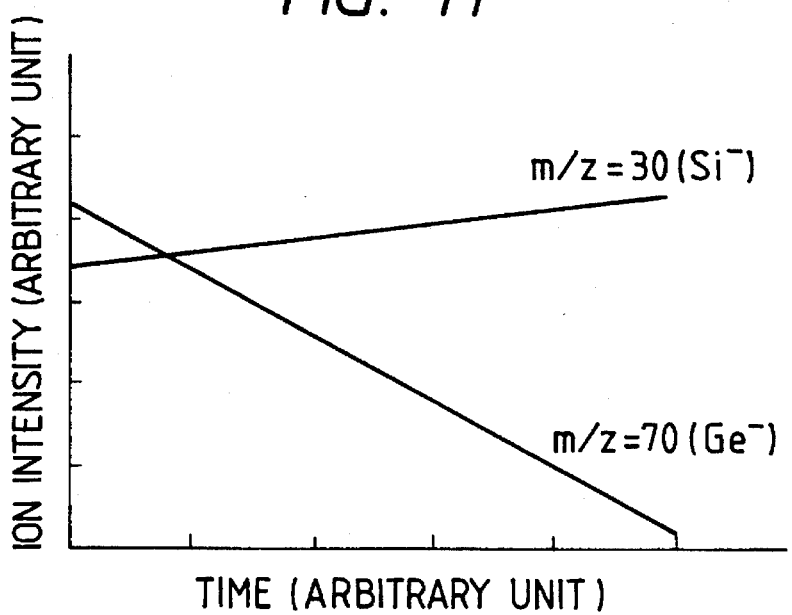

Then, as in the experimental example 1, a portion of the strip-like substrate on which deposited film made of a-SiGe:H was formed in the experimental example 4 was selectively cut out at arbitrary six positions, and the distribution of element in a depth direction was measured. As a result, the distribution of element in the depth direction as shown in FIG. 11 was obtained, and it could be found that the same band gap profile as that shown in FIG. 6B was provided. Also, the determination of all hydrogen contained in the deposited film indicated 15±2 atomic percent.

(Experimental example 5)

Using a deposited film forming apparatus 200 as shown in FIG. 2, a substrate delivery vessel (not shown) and a substrate winding vessel (not shown) were coupled with a gas gate 129 on the inlet side and a gas gate 130 on the outlet side, respectively. The substrate delivery vessel (not shown) and the substrate winding vessel are provided with a substrate delivery mechanism (not shown) for delivering a strip-like substrate 104 and a substrate winding mechanism (not shown) for winding the strip-like substrate 104, respectively.

First, like in the experimental example 1, a bobbin (not shown) having the strip-like substrate 104 (40 cm wide×200 m long×0.125 mm thick) made of stainless (SUS304BA) wound therearound was loaded into the substrate delivery vessel, and the strip-like substrate 104 was passed through the gas gate 129 on the inlet side, first and second film forming vessels 102, 103, and the gas gate 130 on the outlet side to the substrate winding vessel, and the tension adjustment was made so that the strip-like substrate 104 was not loosened. Note that the strip-like substrate 104 must be degreased and cleaned sufficiently prior to the use. And the substrate delivery vessel (not shown), a vacuum vessel 101, each film forming vessel 102, 103, and the substrate winding vessel (not shown) were roughly evacuated by a mechanical booster pump/rotary pump, not shown, and then evacuated to a high vacuum of $5 \times 10^{-6}$ Torr or less by an oil diffusion pump (not shown). Then, each infrared lamp heater 124, 125 was lighted, and the temperature control was made by monitoring the output of each thermocouple 136, 137 so that the surface temperature of the strip-like substrate 104 was at 300° C., whereby the heating and degasification were performed.

After being sufficiently degasified, under the conditions as indicated in Table 1, a source gas for the formation of deposited film was introduced from each gas discharger 114, 115 into each film forming vessel 102, 103 by activating the oil diffusion pump (not shown) connected to each exhaust tube 116, 117. At the same time, a gate gas of H$_2$ gas having a flow of 200 sccm was supplied from each gate gas supply tube 135, 136 into each gas gate 129, 130, and then this gate gas was exhausted through an exhaust tube 138 directly coupled with the vacuum vessel 101, the substrate delivery vessel (not shown) and the substrate winding vessel (not shown). In this state, the pressure within the first and second film forming vessels 102, 103 was held at 1.1 Torr and 1.2 Torr, respectively.

TABLE 5

| Kind and | First gas discharger 114 | |
|---|---|---|
| flow of | SiH$_4$: | 1200 sccm |
| source gas | GeH$_4$: | 550 sccm |
| | H$_2$: | 500 sccm |
| | Second gas discharger 115 | |
| | SiH$_4$: | 400 sccm |
| | GeH$_4$: | 180 sccm |
| | H$_2$: | 200 sccm |
| High | First cathode 201 | 800 W |
| frequency power | Second cathode 202 | 350 W |
| Length of | First film forming vessel 102 | 90 cm |
| film forming region | Second film forming vessel 103 | 40 cm |
| Temperature | First film forming vessel 102 | 260° C. |
| of strip-like substrate 104 | Second film forming vessel 103 | 250° C. |

When the pressure within each film forming vessel 102, 103 was stabilized, a high frequency power having a frequency of 13.56 MHz was applied via high frequency lead wires 203, 204 to cathodes 201, 202, respectively, from a high frequency power source not shown and introduced into each film forming vessel 102, 103. As a result, a high frequency glow discharge was excited within each film forming space 133, 134, and a plasma was generated, but no leakage of high frequency and plasma through a portion of each guard electrode 126 to 128 was found. The size of a high frequency glow discharge region within each film forming vessel 102, 103 may vary depending on the power of incident high frequency or the kind and flow of the source gas, whereby the size of this region was visually observed and obtained as the length of the strip-like substrate 104 over a moving direction thereof. Its results were indicated in the column of film forming region length in Table 5.

Then, the movement of the strip-like substrate 104 was started in a direction from the substrate delivery vessel (not shown) to the substrate winding vessel (not shown). The moving speed at this time was 30 cm/min. A deposited film made of i-type a-SiGe:H was formed on the strip-like substrate 104 while the strip-like substrate 104 was continuously moved for ten minutes.

Note that since the strip-like substrate 104 was long such that the length was 200 m, as in the experimental examples 1 to 4 as previously described, after this experimental example 5, experimental examples 6 and 7 as thereafter described were carried out consecutively with the strip-like substrate 104 mounted on the deposited film forming apparatus 200. After the formation of all deposited films in the experimental examples 5 to 7 was terminated, the strip-like substrate 104 was cooled and taken out of the deposited film forming apparatus 200.

The measurement of film thickness distribution for the deposited film formed in this experimental example 5 indicated that the dispersion of the film thickness was within 5% in both the width direction and the longitudinal direction of the strip-like substrate 104. The calculated forming speed of deposited film was 15 Å/sec in average.

Then, a portion of the strip-like substrate 104 on which deposited film made of a-SiGe:H was formed in the experimental example 5 was selectively cut out at arbitrary six positions, and the distribution of element in a depth direction was measured using a secondary ion mass spectrometer as in the experimental example 1. As a result, the distribution of element in the depth direction as shown in FIG. 8 was obtained, and it could be found that the same band gap profile as that shown in FIG. 6D was provided. Also, the determination of all hydrogen contained in the deposited film using a metal containing-hydrogen analyzer indicated 15±2 atomic percent.

(Experimental example 6)

After the formation of the deposited film was terminated in the experimental example 5, the introduction of the source gas for the formation of deposited film and the gate gas was stopped and the first and second film forming vessels 102, 103 were evacuated to $5 \times 10^{-6}$ Torr, respectively. Subsequently, like in the experimental example 5, the gate gas was supplied and a deposited film of i-type a-SiC:H was continuously formed on the strip-like substrate 104 under the conditions as indicated in Table 6. In this case, the moving speed of the strip-like substrate 104 was 30 cm/min. Also, the internal pressures of the first and second film forming vessels 102, 103 were held at 1.0 Torr and 1.1 Torr, respectively, during the formation of the deposited film.

TABLE 6

| Kind and | First gas discharger 114 | |
|---|---|---|
| flow of | $SiH_4$: | 1400 sccm |
| source gas | $CH_4$: | 200 sccm |
| | $H_2$: | 300 sccm |
| | Second gas discharger 115 | |
| | $SiH_4$: | 500 sccm |
| | $CH_4$: | 220 sccm |
| | $H_2$: | 250 sccm |
| High | First cathode 201 | 900 W |
| frequency | Second cathode 202 | 400 W |
| power | | |
| Length of | First film forming vessel 102 | 95 cm |
| film forming | Second film forming vessel 103 | 45 cm |
| region | | |
| Temperature | First film forming vessel 102 | 240° C. |
| of strip-like | Second film forming vessel 103 | 250° C. |

TABLE 6-continued substrate 104

As in the experimental example 5, after all the formation of deposited film in the experimental examples 5 to 7 was terminated, the measurement of film thickness distribution for the deposited film formed in this experimental example 6 indicated that the dispersion of the film thickness was within 5%, and the calculated forming speed of deposited film was 12 Å/sec in average.

Then, as in the experimental example 5, a portion of the strip-like substrate 104 on which deposited film made of a-SiC:H was formed in the experimental example 6 was selectively cut out at arbitrary six positions, and the distribution of element in a depth direction was measured. As a result, the distribution of element in the depth direction similar to that as shown in FIG. 9 was obtained, and it could be found that the same band gap profile as that shown in FIG. 6C was provided. Also, the determination of all hydrogen contained in the deposited film indicated 13±2 atomic percent.

(Experimental example 7)

After the formation of the deposited film was terminated in the experimental examples 5 and 6, the introduction of the source gas for the formation of deposited film and the gate gas was stopped and the first and second film forming vessels 102, 103 were evacuated to $5 \times 10^{-6}$ Torr, respectively. Subsequently, like in the experimental example 5, the gate gas was supplied and a deposited film of a-Si:H containing B as impurities was continuously formed on the strip-like substrate 104 under the conditions as indicated in Table 7. In this case, the moving speed of the strip-like substrate 104 was 30 cm/min. Also, the internal pressures of the first and second film forming vessels 102, 103 were held at 1.1 Torr and 1.1 Torr, respectively, during the formation of the deposited film.

TABLE 7

| Kind and | First gas discharger 114 | |
|---|---|---|
| flow of | $SiH_4$: | 1500 sccm |
| source gas | $H_2$: | 500 sccm |
| | $BF_3/H_2$ (50 ppm diluted): | 10 sccm |
| | Second gas discharger 115 | |
| | $SiH_4$: | 500 sccm |
| | $H_2$: | 200 sccm |
| | $BF_3/H_2$ (50 ppm diluted): | 8 sccm |
| High | First cathode 201 | 750 W |
| frequency | Second cathode 202 | 320 W |
| power | | |
| Length of | First film forming vessel 102 | 90 cm |
| film forming | Second film forming vessel 103 | 40 cm |
| region | | |
| Temperature | First film forming vessel 102 | 240° C. |
| of strip-like | Second film forming vessel 103 | 250° C. |
| substrate 104 | | |

As in the experimental example 5, after all the formation of deposited film in the experimental examples 5 to 7 was terminated, the measurement of film thickness distribution for the deposited film formed in this experimental example 7 indicated that the dispersion of the film thickness was within 5%, and the calculated forming speed of deposited film was 18 Å/sec in average.

Then, as in the experimental example 5, a portion of the strip-like substrate on which deposited film made of a-Si:H was formed in the experimental example 7 was selectively cut out at arbitrary six positions, and the distribution of element in a depth direction was measured. As a result, the distribution of element in the depth direction similar to that as shown in FIG. 10 was obtained, and it could be found that the same fermi level profile as that shown in FIG. 7C was provided. Also, the determination of all hydrogen contained in the deposited film indicated 17±2 atomic percent.

(Experimental example 8)

Using a continuous deposited film forming apparatus 300 as shown in FIG. 3, an amorphous silicon type solar cell having a layer constitution as shown in FIG. 5A was fabricated. This amorphous silicon solar cell had a single pin junction with the band gap profile in an i-type semiconductor layer 404 shown in FIG. 6D.

First, a strip-like substrate 104 made of SUS430BA which was the same as that used in the experimental example 1 as previously described was loaded into a continuous sputtering apparatus not shown, and a 1000 Å thick Ag thin film was deposited by sputtering on the strip-like substrate 104 with Ag electrode (Ag purity: 99.99%) as a target. Further, a 1.2 μm thick ZnO thin film was deposited by sputtering on the Ag thin film with ZnO (ZnO purity: 99.999%) electrode as a target so as to form an under electrode 402 on the strip-like substrate 104.

Next, the strip-like substrate 104 having the under electrode 402 formed thereon was loaded into the substrate delivery vessel 301, and passed through the first impurity layer forming vacuum vessel 302, the deposited film forming apparatus 100, and the second impurity layer forming vacuum vessel 303 to the substrate winding vessel 304. And the tension adjustment was made so that the strip-like substrate 104 was not loosened, and like in the experimental example 1, each impurity layer forming vacuum vessel 302, 303, the deposited film forming apparatus 100, the substrate delivery vessel 301 and the substrate winding vessel 304 were evacuated to a high vacuum of 5×10$^{-6}$ Torr or less.

Subsequently, an n-type semiconductor layer 403, an i-type semiconductor layer 404 and a p-type semiconductor layer 405 were formed sequentially in the first impurity layer forming vacuum vessel 302, the deposited film forming apparatus 100 and the second impurity layer forming vacuum vessel 303 on the strip-like substrate 104, respectively, while the strip-like substrate 104 was continuously moved from the substrate delivery vessel 301 to the substrate winding vessel 304. The conditions for forming the n-type semiconductor layer 403 and the p-type semiconductor layer 405 are as indicated in Table 8. The conditions for forming the i-type semiconductor layer 404 were the same as when the deposited film of i-type a-SiGe:H was formed in the experimental example 1. The formation of semiconductor layers 403 to 405 was performed in such a manner that a microwave glow discharge was excited within the impurity layer forming vacuum vessels 302, 303 and within the deposited film forming apparatus 100, and if a plasma produced by glow discharge was stabilized, the strip-like substrate 104 was moved at a moving speed of 95 cm/min. Note that the length of a microwave glow discharge region within each impurity layer forming vacuum vessel 302, 303 in a moving direction of the strip-like substrate 104 is indicated in the column of film forming region length in Table 8.

TABLE 8

|  | n-type semiconductor layer | p-type semiconductor layer |
|---|---|---|
| Kind and flow of source gas | SiH$_4$: 25 sccm<br>H$_2$: 300 sccm<br>PH$_3$/H$_2$ (1% diluted): 5 sccm | SiH$_4$: 22 sccm<br>H$_2$: 380 sccm<br>B$_2$H$_6$/H$_2$ (3000 ppm diluted): 20 sccm |
| Microwave power | 600 W × 2 | 700 W × 2 |
| Length of film forming region | 15 cm in peripheral length of cylinder of 10 cm in diameter | 5 cm in peripheral length of cylinder of 9 cm in diameter |
| Substrate temperature | 290° C. | 270° C. |
| Pressure | 9 mTorr | 8 mTorr |

If the semiconductor layers 403 to 405 were formed over the entire length of the strip-like substrate 104 (200 m), the strip-like substrate 104 was cooled and then taken out of the continuous deposited film forming apparatus 300. Further a transparent electrode 306 and a collector electrode 307 were formed on the p-type semiconductor layer 405, whereby a strip-like solar cell was completed.

Then, using a continuous modularizing apparatus (not shown), the fabricated solar cell was processed into a number of solar cell modules, each 36 cm×22 cm in size. The characteristic evaluation for the fabricated solar cell module was conducted using the artificial solar rays having an AM value of 1.5 and an energy density of 100 mw/cm$^2$, so that it could be found that the photoelectric conversion efficiency was 7.8% or greater, and the dispersion in the solar cell module characteristics was within 5%. Two of the fabricated solar cell modules were extracted, and two hundred times repetitive bending test was conducted and indicated that there was no phenomenon of exfoliation of deposited film without degradation of characteristics after the test. Further, after continuous irradiation to the artificial solar rays having an energy density of 100 mw/cm$^2$ with the same AM value of 1.5, for five hundred hours, it was indicated that the variation of the photoelectric conversion efficiency was within 8.5% with respect to the initial value.

With such solar cell modules interconnected, a power supply system having an output of 5 kW could be fabricated.

(Experimental example 9)

While in the experimental example 8, a-SiGe:H deposited film was used as the i-type semiconductor layer 404, a solar cell was fabricated herein using a-SiC:H, instead of a-SiGe:H. The conditions were the same as in the experimental example 8, except that this i-type semiconductor layer 404 was deposited in the same conditions as in the experimental example 2. Note that the i-type semiconductor layer 404 has a band gap profile as shown in FIG. 6C.

For the fabricated solar cell module, the characteristic evaluation was conducted, like in the experimental example 8, so that it could be found that the photoelectric conversion efficiency was 7.2% or greater, and the dispersion in the solar cell module characteristics was within 5%. After continuous two hundred times repetitive bending test, there were no degradation of characteristics and no phenomenon of exfoliation of deposited film. Further, after continuous five hundred hour irradiation to the artificial solar rays, it was indicated that the variation of the photoelectric conversion efficiency was within 8.5% with respect to the initial value. By the use of such solar cell modules, a power supply system having an output of 5 kW could be fabricated.

(Experimental example 10)

While in the experimental example 8, a-SiGe:H deposited film was used as the i-type semiconductor layer 404, a solar cell was fabricated herein using a-Si:H, instead of a-SiGe:H, and processed into solar cell modules. The conditions were the same as in the experimental example 8, except that this i-type semiconductor layer 404 was deposited in the same conditions as in the experimental example 3. Note that the i-type semiconductor layer 404 has a fermi level profile as shown in FIG. 7B.

For the fabricated solar cell-module, the characteristic evaluation was conducted, like in the experimental example 8, so that it could be found that the photoelectric conversion efficiency was 8.4% or greater, and the dispersion in the solar cell module characteristics was within 5%. After continuous two hundred times repetitive bending test, there were no degradation of characteristics and no phenomenon of exfoliation of deposited film. Further, after continuous five hundred hour irradiation to the artificial solar rays, it was indicated that the variation of the photoelectric conversion efficiency was within 8.5% with respect to the initial value. By the use of such Solar cell modules, a power supply system having an output of 5 kW could be fabricated.

(Experimental example 11)

An amorphous silicon type solar cell having two pin junctions laminated was fabricated as shown in FIG. 5C, and processed into solar cell modules. In this fabrication, an apparatus was used in which the first impurity layer forming vacuum vessel 302, the deposited film forming apparatus 100 and the second impurity layer forming vacuum vessel 303 in the continuous film forming apparatus 300 were connected in series sequentially between the second impurity layer forming vacuum vessel 303 and the substrate winding vessel 304 in the continuous deposited film forming apparatus 300 as shown in FIG. 3, so that two pin junctions could be formed.

Using the strip-like substrate 104 equivalent to that as used in the experimental example 1, of two pin junctions, a first pin junction 411 remote from the incident side of the light was formed in the same conditions as in the experimental example 8, and a second pin junction 412 proximal from the incident side of the light was formed in the same conditions as the pin junction in the experimental example 10. After the formation of first and second pin junctions 411, 412, solar cell modules were made in the same process as in the experimental example 8.

For the fabricated solar cell module, the characteristic evaluation was conducted, like in the experimental example 8, so that it could be found that the photoelectric conversion efficiency was 11.0% or greater, and the dispersion in the solar cell module characteristics was within 5%. After continuous two hundred times repetitive bending test, there were no degradation of characteristics and no phenomenon of exfoliation of deposited film. Further, after continuous five hundred hour irradiation to the artificial solar rays, it was indicated that the variation of the photoelectric conversion efficiency was within 7.5% with respect to the initial value. By the use of such solar cell modules, a power supply system having an output of 5 kW could be fabricated.

(Experimental example 12)

An amorphous silicon type solar cell having two pin junctions laminated was fabricated as shown in FIG. 5C, and processed into solar cell modules. The fabrication was made in the same conditions as in the experimental example 11, except that a first pin junction 411 was formed in the same conditions as the pin junction in the experimental example 10, and a second pin junction 412 was formed in the same conditions as the pin junction in the experimental example 9.

For the fabricated solar cell module, the characteristic evaluation was conducted, like in the experimental example 8, so that it could be found that the photoelectric conversion efficiency was 10.5% or greater, and the dispersion in the solar cell module characteristics was within 5%. After continuous two hundred times repetitive bending test, there were no degradation of characteristics and no phenomenon of exfoliation of deposited film. Further, after continuous five hundred hour irradiation to the artificial solar rays, it was indicated that the variation of the photoelectric conversion efficiency was within 7.5% with respect to the initial value. By the use of such solar cell modules, a power supply system having an output of 5 kW could be fabricated.

(Experimental example 13)

An amorphous silicon type solar cell having three pin junctions laminated was fabricated as shown in FIG. 5D, and processed into solar cell modules. In this fabrication, an apparatus was used in which the first impurity layer forming vacuum vessel 302, the deposited film forming apparatus 100, the second impurity layer forming vacuum vessel 303, the first impurity layer forming vacuum vessel 302, the deposited film forming apparatus 100, and the second impurity layer forming vacuum vessel 303 in the continuous film forming apparatus 300 were connected in series sequentially between the second impurity layer forming vacuum vessel 303 and the substrate winding vessel 304 in the continuous deposited film forming apparatus 300 as shown in FIG. 3, so that three pin junctions could be formed.

Using the strip-like substrate 104 equivalent to that as used in the experimental example 1, of three pin junctions, a first pin junction 411 remote from the incident side of the light was formed in the same conditions as the pin junction in the experimental example 8, a second pin junction 412 was formed in the same conditions as the pin junction in the experimental example 10, and a third pin junction 413 was formed in the same conditions as the pin junction in the experimental example 9. After the formation of each pin junction 411 to 413, solar cell modules were made in the same process as in the experimental example 8.

For the fabricated solar cell module, the characteristic evaluation was conducted, like in the experimental example 8, so that it could be found that the photoelectric conversion efficiency was 12.0% or greater, and the dispersion in the solar cell module characteristics was within 5%. After continuous two hundred times repetitive bending test, there were no degradation of characteristics and no phenomenon of exfoliation of deposited film. Further, after continuous five hundred hour irradiation to the artificial solar rays, it was indicated that the variation of the photoelectric conversion efficiency was within 7% with respect to the initial value. By the use of such solar cell modules, a power supply system having an output of 5 kW could be fabricated.

(Experimental example 14)

Using a continuous deposited film forming apparatus 350 as shown in FIG. 4, an amorphous silicon type solar cell having a layer constitution as shown in FIG. 5A was fabricated, and processed into solar cell modules. This amorphous silicon solar cell had a single pin junction with the band gap profile in the i-type semiconductor layer 404 shown in FIG. 6D.

First, a strip-like substrate 104 made of SUS430BA which was the same as that used in the experimental example 1 as previously described was loaded into a continuous sputtering apparatus not shown, and a 1000 Å thick Ag thin film was deposited by sputtering on the strip-like substrate 104 with Ag electrode (Ag purity: 99.99%) as a target. Further, a 1.2 μm thick ZnO thin film was deposited by sputtering on the Ag thin film with ZnO (ZnO purity: 99.999%) electrode as a target so as to form an under electrode 402 on the strip-like substrate 104.

Next, the strip-like substrate 104 having the under electrode 402 formed thereon was loaded into the substrate delivery vessel 301, and passed through the first impurity layer forming vacuum vessel 351, the deposited film forming apparatus 200, and the second impurity layer forming vacuum vessel 352 to the substrate winding vessel 304. And the tension adjustment was made so that the strip-like substrate 104 was not loosened, and like in the experimental example 1, each impurity layer forming vacuum vessel 351, 352, the deposited film forming apparatus 200, the substrate delivery vessel 301 and the substrate winding vessel 304 were evacuated to a vacuum of $5 \times 10^{-6}$ Torr.

Subsequently, an n-type semiconductor layer 403, an i-type semiconductor layer 404 and a p-type semiconductor layer 405 were formed sequentially in the first impurity layer forming vacuum vessel 351, the deposited film forming apparatus 200 and the second impurity layer forming vacuum vessel 352 on the strip-like substrate 104, respectively, while the strip-like substrate 104 was continuously moved from the substrate delivery vessel 301 to the substrate winding vessel 304. The conditions for forming the n-type semiconductor layer 403 and the p-type semiconductor layer 405 are indicated in Table 9. The conditions for forming the i-type semiconductor layer 404 were the same as when the deposited film of i-type a-SiGe:H was formed in the experimental example 5. The formation of semiconductor layers 403 to 405 was performed in such a manner that a high frequency glow discharge was excited within the impurity layer forming vacuum vessels 351, 352 and within the deposited film forming apparatus 200, and if a plasma produced by glow discharge was stabilized, the strip-like substrate 104 was moved at a moving speed of 30 cm/min. Note that the length of a high frequency glow discharge region within each impurity layer forming vacuum vessel 351, 352 in a moving direction of the strip-like substrate 104 is indicated in the column of film forming region length in Table 9.

TABLE 9

|  | n-type semiconductor layer | p-type semiconductor layer |
| --- | --- | --- |
| Kind and flow of source gas | SiH$_4$: 200 sccm<br>H$_2$: 400 sccm<br>PH$_3$/H$_2$ (1% diluted): 60 sccm | SiH$_4$: 25 sccm<br>H$_2$: 900 sccm<br>B$_2$H$_6$/H$_2$ (3000 ppm diluted): 50 sccm |
| High frequency power | 400 W | 700 W |
| Length of film forming region | 10 cm | 4 cm |
| Substrate | 250° C. | 220° C. |

TABLE 9-continued

|  | n-type semiconductor layer | p-type semiconductor layer |
| --- | --- | --- |
| temperature |  |  |

If the semiconductor layers 403 to 405 were formed over the entire length of the strip-like substrate 104 (200 m), the strip-like substrate 104 was cooled and then taken out of the continuous deposited film forming apparatus 350. Further, a transparent electrode 406 and a collector electrode 407 were formed on the p-type semiconductor layer 405, whereby a strip-like solar cell was completed.

Then, using a continuous modularizing apparatus (not shown), the fabricated solar cell was processed into a number of solar cell modules, each 36 cm×22 cm in size. The characteristic evaluation for the fabricated solar cell module was conducted using the artificial solar rays having an AM value of 1.5 and an energy density of 100 mw/cm$^2$, so that it could be found that the photoelectric conversion efficiency was 7.6% or greater, and the dispersion in the solar cell module characteristics was within 5%. Two of the fabricated solar cell modules were extracted, and two hundred times repetitive bending test was conducted and indicated that there was no phenomenon of exfoliation of deposited film without degradation of characteristics after the test. Further, after continuous irradiation to the artificial solar rays having an energy density of 100 mw/cm$^2$ with the same AM value of 1.5, for five hundred hours, it was indicated that the variation of the photoelectric conversion efficiency was within 8.7% with respect to the initial value.

With such solar cell modules interconnected, a power supply system having an output of 5 kW could be fabricated.

(Experimental example 15)

An amorphous silicon type solar cell having two pin junctions laminated was fabricated as shown in FIG. 5C, and processed into solar cell modules. In this fabrication, an apparatus was used in which the first impurity layer forming vacuum vessel 351, the deposited film forming apparatus 200 and the second impurity layer forming vacuum vessel 352 in the continuous film forming apparatus 350 were connected in series sequentially between the second impurity layer forming vacuum vessel 352 and the substrate winding vessel 304 in the continuous deposited film forming apparatus 350 as shown in FIG. 4, so that two pin junctions could be formed.

Using the strip-like substrate 104 equivalent to that as used in the experimental example 1, of two pin junctions, a first pin junction 411 remote from the incident side of the light was formed in the same conditions as the pin junction in the experimental example 14, and a second pin junction 412 proximal to the incident side of the light was formed in such a way that the i-type semiconductor layer was formed in the same conditions as in the experimental example 7, and the p-type semiconductor layer and the n-type semiconductor layer were formed in the conditions as indicated in Table 9. After the formation of first and second pin junctions 411, 412, solar cell modules were made in the same process as in the experimental example 8.

For the fabricated solar cell module, the characteristic evaluation was conducted, like in the experimental example 8, so that it could be found that the photoelectric conversion efficiency was 10.5% or greater, and the dispersion in the solar cell module characteristics was within 5%. After continuous two hundred times repetitive bending test, there were no degradation of characteristics and no phenomenon of exfoliation of deposited film. Further, after continuous five hundred hour irradiation to the artificial solar rays, it was indicated that the variation of the photoelectric conversion efficiency was within 7.8%. By the use of such solar cell modules, a power supply system having an output of 5 kW could be fabricated.

(Experimental example 16)

An amorphous silicon type solar cell having three pin junctions laminated was fabricated as shown in FIG. 5D, and processed into solar cell modules. In this fabrication, an apparatus was used in which the first impurity layer forming vacuum vessel 351, the deposited film forming apparatus 200, the second impurity layer forming vacuum vessel 352, the first impurity layer forming vacuum vessel 351, the deposited film forming apparatus 200, and the second impurity layer forming vacuum vessel 352 in the continuous film forming apparatus 350 were connected in series sequentially between the second impurity layer forming vacuum vessel 352 and the substrate winding vessel 304 in the continuous deposited film forming apparatus 350 as shown in FIG. 4, so that three pin junctions could be formed.

Using the strip-like substrate 104 equivalent to that as used in the experimental example 1, of three pin junctions, a first pin junction 411 remote from the incident side of the light was formed in the same conditions as the pin junction in the experimental example 15, a second pin junction 412 was formed also in the same conditions as the pin junction in the experimental example 15, and a third pin junction 413 proximal to the incidental side of the light was formed in such a way that the i-type semiconductor layer was formed in the same conditions as in the experimental example 6, and the n-type semiconductor layer and the p-type semiconductor layer were formed in the conditions as indicated in Table 9. After the formation of each pin junction 411 to 413, solar cell modules were made in the same process as in the experimental example 8.

For the fabricated solar cell module, the characteristic evaluation was conducted, like in the experimental example 8, so that it could be found that the photoelectric conversion efficiency was 12.0% or greater, and the dispersion in the solar cell module characteristics was within 5%. After continuous two hundred times repetitive bending test, there were no degradation of characteristics and no phenomenon of exfoliation of deposited film. Further, after continuous five hundred hour irradiation to the artificial solar rays, it was indicated that the variation of the photoelectric conversion efficiency was within 7.2% with respect to the initial value. By the use of such solar cell modules, a power supply system having an output of 5 kW could be fabricated.

Thus, the embodiments of the present invention were described mainly in the instance of fabricating an amorphous silicon type solar cell, but the present invention can be suitably applied to the instance of fabricating a thin film semiconductor element requiring a large area and a long length, besides the amorphous silicon type solar cell. Such a thin film semiconductor element may be for example a thin film transistor (TFT) for driving the pixels of a liquid crystal display, a photoelectric conversion element for contact-type image sensor, or a switching element. The thin film semiconductor elements are used as main component for the image input apparatus in most cases, and the present invention allows for the mass production of these thin film semiconductor elements with high quality and uniformity, whereby it is expected that the image input/output apparatus will spread more widely.

Next, the deposited film having its composition controlled in a direction of film thickness to be formed by the deposited film forming method of the present invention will be exemplified.

Examples of such deposited film include IV-group alloy semiconductor thin films such as SiGe, SiC, GeC, SiSn, GeSn and SnC, III-V-group compound semiconductor thin films such as GaAs, GaP, GaSb, InP and InAs, II-VI-group compound semiconductor thin films such as ZnSe, ZnS, ZnTe, CdS, CdSe and CdTe, I-III-VI-group compound semiconductor thin films such as $CuAlS_2$, $CuAlSe_2$, $CuAlTe_2$, $CuInS_2$, $CuInSe_2$, $CuInTe_2$, $CuGaS_2$, $CuGaSe_2$, $CuGaTe$, $AgInSe_2$ and $AgInTe_2$, II-IV-V-group compound semiconductor thin films such as $ZnSiP_2$, $ZnGeAs_2$, $CdSiAs_2$ and $CdSnP_2$, oxide semiconductor thin films such as $Cu_2O$, $TiO_2$, $In_2O_3$, $SnO_2$, $ZnO$, $CdO$, $Bi_2O_3$ and $CdSnO_4$, and the semiconductor thin films containing a valence electron control element for controlling the valence electron. Also, IV-group semiconductor thin films such as Si, Ge and C containing a valence electron control element may be used. Of course, amorphous semiconductors such as a-Si:H and a-Si:H:F having varied content of hydrogen and/or fluorine may be used.

By making the composition control in the semiconductor thin film as above described, the forbidden band width control, the valence electron control, the refractive index control, and the crystal control can be performed. By forming the deposited film having the composition controlled in a direction of film thickness on the substrate, a large-area thin film semiconductor device excellent in electrical, optical and mechanical characteristics can be fabricated. That is, if the forbidden band width and/or valence electron density is changed in the direction of film thickness for the semiconductor layer deposited, the electrical characteristics can be improved by raising the traveling property of carriers or preventing the recombination of carriers on the semiconductor interface. Also, if the refractive index is changed continuously, an optically unreflecting surface can be provided, and the light transmittance into the semiconductor layer can be improved. Further, if the content of hydrogen is changed, some structural change can be provided, the internal pressure is relieved, and the deposited film having a high adhesion to the substrate can be formed.

The deposited film forming source gas for use in forming the deposited film as previously described is introduced into the film forming space by appropriately adjusting the mixture ratio in accordance with a desired composition of the deposited film.

Examples of the compound containing a IV-group element in the periodic table which is suitably used for forming the IV-group semiconductor or IV-group alloy semiconductor thin film, as above described, include compounds containing Si atom, Ge atom, C atom, Sn atom or Pb atom, and specifically, silane-type compounds such as $SiH_4$, $Si_2H_6$, $Si_3H_8$, $Si_3H_6$, $Si_4H_8$ and $Si_5H_{10}$, silane halide compounds such as $SiF_4$, $(SiF_2)_5$, $(SiF_2)_6$, $(SiF_2)_4$, $Si_2F_6$, $Si_3F_8$, $SiHF_3$, $SiH_2F_2$, $Si_2H_2F_4$, $Si_2H_3F_3$, $SiCl_4$, $(SiCl_2)_5$, $SiBr_4$, $(SiBr_2)_5$, $Si_2Cl_6$, $Si_2Br_6$, $SiHCl_3$, $SiHBr_3$, $SiHI_3$ and $Si_2Cl_3F_3$, germane compounds such as $GeH_4$ and $Ge_2H_6$, germanium halide compounds such as $GeF_4$, $(GeF_2)_5$, $(GeF_2)_6$, $(GeF_2)_4$, $Ge_2F_6$, $Ge_3F_8$, $GeHF_3$, $GeH_2F_2$, $Ge_2H_2F_4$, $Ge_2H_3F_3$, $GeCl_4$, (GeCl$_2$)$_5$, GeBr$_4$, (GeBr$_2$)$_5$, Ge$_2$Cl$_6$, Ge$_2$Br$_6$, GeHCl$_3$, GeHBr$_3$, GeHI$_3$ and Ge$_2$Cl$_3$F$_3$, hydrocarbons of methane series such as CH$_4$, C$_2$H$_6$ and C$_3$H$_8$, hydrocarbons of ethylene series such as C$_2$H$_4$ and C$_3$H$_6$, cyclic hydrocarbon such as C$_6$H$_6$, carbon halide compounds such as CF$_4$, (CF$_2$)$_5$, (CF$_2$)$_6$, (CF$_2$)$_4$, C$_2$F$_6$, C$_3$F$_8$, CHF$_3$, CH$_2$F$_2$, CCl$_4$, (CCl$_2$)$_5$, CBr$_4$, (CBr$_2$)$_5$, C$_2$Cl$_6$, C$_2$Br$_6$, CHCl$_3$, CHI$_3$ and C$_2$Cl$_3$F$_3$, tin compounds such as SnH$_4$ and Sn(CH$_3$)$_4$, and lead compounds such as Pb(CH$_3$)$_4$ and Pb(C$_2$H$_5$)$_6$. The compound may be used singly or in a combination of two or more kinds.

Examples of the valence electron control agent useful to control the valence electron for the IV-group semiconductor or IV-group alloy semiconductor as above described include, as p-type impurities, suitably III-group elements in the periodic table such as B, Al, Ga, In. and Tl, and as n-type impurities, suitably V-group elements in the periodic table such as N, P, As, Sb and Bi. Among them, B, Ga, P and Sb are most suitable. The amount of impurities to be doped is appropriately determined in accordance with the electrical and optical characteristics required. The source material for the introduction of such impurities may be in the gas state at the ordinary temperature and pressure, or readily gasified at least under the film formation conditions. Examples of the starting material for the introduction of such impurities include specifically PH$_3$, P$_2$H$_4$, PF$_3$, PF$_5$, PCl$_3$, AsH$_3$, AsF$_3$, AsF$_5$, AsCl$_3$, SbH$_3$, SbF$_5$, BiH$_3$, BF$_3$, BCl$_3$, BBr$_3$, B$_2$H$_6$, B$_4$H$_{10}$, B$_5$H$_9$, B$_5$H$_{11}$, B$_6$H$_{10}$, B$_6$H$_{12}$ and AlCl$_3$. The compound containing such impurities may be used singly or in a combination of two or more kinds.

Examples of the compound containing II-group element in the periodic table for use in forming II-VI-group compound semiconductor as above described include specifically Zn(CH$_3$)$_2$, Zn(C$_2$H$_5$)$_2$, Zn(OCH$_3$)$_2$, Zn(OC$_2$H$_5$)$_2$, Cd(CH$_3$)$_2$, Cd(C$_2$H$_5$)$_2$, Cd(C$_3$H$_7$)$_2$, Cd(C$_4$H$_9$)$_2$, Hg(CH$_3$)$_2$, Hg(C$_2$H$_5$)$_2$, Hg(C$_6$H$_5$)$_2$ and Hg[C=(C$_6$H$_5$)]$_2$. Also, examples of the compound containing VI-group element in the periodic table include specifically NO, N$_2$O, CO$_2$, CO, H$_2$S, SCl$_2$, S$_2$Cl$_2$, SOCl$_2$, SeH$_2$, SeCl$_2$, Se$_2$Br$_2$, Se(CH$_3$)$_2$, Se(C$_2$H$_5$)$_2$, TeH$_2$, Te(CH$_3$)$_2$ and Te(C$_2$H$_5$)$_2$. Of course, the source material may be used singly or in a combination of two or more kinds.

The valence electron control agent useful to control the valence electron of II-VI-group compound semiconductor may be effectively a compound containing I, III, IV or V-group element in the periodic table. Specifically, examples of the compound containing I-group element include suitably LiC$_3$H$_7$, Li(sec-C$_4$H$_9$), Li$_2$S, and Li$_3$N. Examples of the compound containing III-group element include BX$_3$, B$_2$H$_6$, B$_4$H$_{10}$, B$_5$H$_9$, B$_5$H$_{11}$, B$_6$H$_{10}$, B(CH$_3$)$_3$, B(C$_2$H$_5$)$_3$, B$_6$H$_{12}$, AlX$_3$, Al(CH$_3$)$_2$Cl, Al(CH$_3$)$_3$, Al(OCH$_3$)$_3$, Al(CH$_3$)Cl$_2$, Al(C$_2$H$_5$)$_3$, Al(OC$_2$H$_5$)$_3$, Al(CH$_3$)$_3$Cl$_3$, Al(i-C$_4$H$_9$)$_3$, Al(i-C$_3$H$_7$)$_3$, Al(C$_3$H$_7$)$_3$, Al(OC$_4$H$_9$)$_3$, GaX$_3$, Ga(OCH$_3$)$_3$, Ga(OC$_2$H$_5$)$_3$, Ga(OC$_3$H$_7$)$_3$, Ga(OC$_4$H$_9$)$_3$, Ga(CH$_3$)$_3$, Ga$_2$H$_6$, GaH(C$_2$H$_5$)$_2$, Ga(OC$_2$H$_5$)(C$_2$H$_5$)$_2$, In(CH$_3$)$_3$, In(C$_3$H$_7$)$_3$ and In(C$_4$H$_9$)$_3$, and examples of the compound containing V-group element include NH$_3$, HN$_3$, N$_2$H$_5$N$_3$, N$_2$H$_4$, NH$_4$N$_3$, PX$_3$, P(OCH$_3$)$_3$, P(OC$_2$H$_5$)$_3$, P(OC$_3$H$_7$)$_3$, P(OC$_4$H$_9$)$_3$, P(CH$_3$)$_3$, P(C$_2$H$_5$)$_3$, P(C$_3$H$_7$)$_3$, P(C$_4$H$_9$)$_3$, P(SCN)$_3$, P$_2$H$_4$, PH$_3$, AsH$_3$, AsX$_3$, As(OCH$_3$)$_3$, As(OC$_2$H$_5$)$_3$, As(OC$_3$H$_7$)$_3$, As(OC$_4$H$_9$)$_3$, As(CH$_3$)$_3$, As(C$_2$H$_5$)$_3$, As(C$_6$H$_5$)$_3$, SbX$_3$, Sb(OCH$_3$)$_3$, Sb(OC$_2$H$_5$)$_3$, Sb(OC$_3$H$_7$)$_3$, Sb(OC$_4$H$_9$)$_3$, Sb(CH$_3$)$_3$, Sb(C$_3$H$_7$)$_3$ and Sb(C$_4$H$_9$)$_3$. Note that X indicates a halogen element (F, Cl, Br, I). Of course, the source material may be used singly or in a combination of two or more kinds. Further, the compound containing IV-group element may be any one of the previously cited compounds.

Examples of the compound containing III-group element in the periodic table for use in forming the III-V-group compound semiconductor are those as described above with the compound containing III-group element useful to control the valence electron of II-VI-group compound semiconductor, and examples of the compound containing V-group element in the periodic table are those as described above with the compound containing V-group element useful to control the valence electron of II-VI-group compound semiconductor. Of course, the source material may be used singly or in a combination of two or more kinds.

Examples of the valence electron control agent useful to control the valence electron of III-V-group compound semiconductor include effectively compounds containing II, IV, or VI-group element in the periodic table. Such compound may be a compound containing II-group element as above described, a compound containing IV-group element as above described, or a compound containing VI-group element as above described.

The source gas as above described may be introduced into the deposited film forming apparatus in a mixture with a rare gas such as He, Ne, Ar, Kr, Xe, or a dilution gas such as H$_2$, HF, HCl. Such rare gas or dilution gas may be introduced, independently of the source gas, into the deposited film forming apparatus.

According to the present invention, the deposited film having a distribution of composition in a direction of film thickness can be formed on a large-size substrate continuously and without dispersion in the characteristics, so that the present invention can provide the following applications:

(1) It is possible to form a solar cell having a high photoelectric conversion efficiency on a relatively wide and long substrate at a high production efficiency, continuously and stably.

(2) It is possible to form a semiconductor layer having a band gap continuously changed in a direction of film thickness on a continuously moving strip-like substrate.

(3) It is possible to form a semiconductor layer having the density of valence electron continuously changed in a direction of film thickness on a continuously moving strip-like substrate.

What is claimed is:

1. A method of forming a photoelectric deposited film which has substantially uniform conductivity comprising the steps of:

continuously moving an elongated substrate into or out of a chamber;

flowing a first source gas containing a plurality of materials as a deposited film source from a first gas discharge means to a first gas exhaust means in a direction parallel to said elongated substrate and opposite to a conveying direction of said substrate to form a first film;

applying a discharge energy to said first gas;

varying at least one of the discharge energy and first source gas flow to vary the composition distribution of said first film in the direction of film thickness;

flowing a second source gas containing a plurality of materials from a second gas discharge means to a second gas exhaust means in a direction parallel to said elongated substrate and parallel to said conveying direction of said elongated substrate to form a second film on said first film to form the deposited film which comprises the first and second films;

applying a discharge energy to said second gas;

varying at least one of the discharge energy and second source gas flow to vary the composition distribution of said second film in the direction of film thickness;

whereby the variation in composition distribution of said first and second films enhances the photoelectric conversion efficiency of the deposited film.

2. The deposited film forming method according to claim 1, wherein said discharge energy is supplied by microwave.

3. The deposited film forming method according to claim 1, wherein said first or second gas discharge means discharges more of the first or second gas in the vicinity of an end portion of said elongated substrate than an amount of the gas found at a center portion of said elongated substrate in the width direction of said elongated substrate.

4. The deposited film forming method according to claim 1, wherein said first or second gas exhaust means exhausts more of the first or second gas in the vicinity of an end portion of said elongated substrate than an amount of the gas found at a center portion of said elongated substrate in the width direction of said elongated substrate.

5. The deposited film forming method according to claim 1, wherein said discharge energy is supplied by a microwave energy.

6. The deposited film forming method according to claim 1, wherein said discharge energy is supplied by a high frequency energy.

7. The deposited firm forming method according to claim 1, wherein said discharge energy is supplied by a plurality of discharge means.

8. The deposited film forming method according to claim 7, wherein the number of said discharge means on a first gas side is greater than the number of said discharge means on a second gas side.

9. The deposited film forming method according to claim 1, wherein said source gas contains at least Ge atoms.

10. The deposited film forming method according to claim 1, wherein said source gas contains at least C atoms.

11. The deposited film forming method according to claim 1, wherein said source gas contains at least Si atoms.

12. The deposited film forming method according to claim 1, wherein the gas discharge means includes a gas discharge hole shape which is selected from the group consisting of slit-shaped, circular, elliptical, sponge-shaped and mesh-shaped.

13. The deposited film forming method according to claim 1, wherein at least one of said first or second gas exhaust means includes a gas exhaust hole shape which is selected from the group consisting of slit-shaped, circular, elliptical, sponge-shaped, or mesh-shaped.

14. A method of forming a photoelectric deposited film comprising the steps of:

continuously moving an elongated substrate into or out of a chamber;

flowing a source gas containing a plurality of materials as a deposited film source in a direction along and parallel to said elongated substrate, by a gas flow forming means to form a gas flow; and applying discharge energy to said gas flow by a plurality of discharge means provided in a conveying direction of said elongated substrate, thereby depositing a deposited film with substantially uniform conductivity;

varying at least one of the discharge energy and source gas flow to vary the composition distribution of the film in the direction of film thickness;

whereby the variation in composition distribution of said deposited film enhances the photoelectric conversion efficiency of the deposited film.

15. The deposited film forming method according to claim 14, wherein said forming means comprises gas discharge means and gas exhaust means.

16. The deposited film forming method according to claim 15, wherein said gas discharge means discharges more gas in the vicinity of an end portion of said elongated substrate than an amount of the gas found at a center portion of said elongated substrate in the width direction of said elongated substrate.

17. The deposited film forming method according to claim 15, wherein said gas exhaust means exhausts more gas in the vicinity of an end portion of said elongated substrate than an amount of the gas found at a center portion of said elongated in the width direction of said elongated substrate.

18. The deposited film forming method according to claim 14, wherein said discharge energy is supplied by microwave energy.

19. The deposited film forming method according to claim 14, wherein said discharge energy is supplied by high frequency energy.

20. The deposited film forming method according to claim 14, wherein said gas flow comprises a first gas flow in a direction opposite to a conveying direction of said elongated substrate and a second gas flow in said conveying direction.

21. The deposited film forming method according to claim 20, wherein the number of said gas discharge means on a first gas flow side is greater than the number of said discharge means on a second gas flow side.

22. The deposited film forming method according to claim 14, wherein said source gas contains at least Ge atoms.

23. The deposited film forming method according to claim 14, wherein said source gas contains at least C atoms.

24. The deposited film forming method according to claim 14, wherein said source gas contains at least Si atoms.

25. The deposited film forming method according to claim 15, wherein the gas discharge means includes a gas discharge hole shape which is selected from the group consisting of slit-shaped, circular, elliptical, sponge-shaped and mesh-shaped.

26. The deposited film forming method according to claim 15, wherein said gas exhaust means includes a gas exhaust hole shape which is selected from the group consisting of slit-shaped, circular, elliptical, sponge-shaped and mesh-shaped.

* * * * *

UNITED STATES PATENT AND TRADEMARK OFFICE
CERTIFICATE OF CORRECTION

PATENT NO. : 5,468,521

DATED : November 21, 1995

INVENTOR(S): MASAHIRO KANAI ET AL.                    Page 1 of 4

It is certified that error appears in the above-identified patent and that said Letters Patent is hereby corrected as shown below:

Title page,
AT [56] REFERENCES CITED

U.S. Patent Documents, "Dochler" should read --Doehler--.

COLUMN 1

Line 4, "continuation," should read --continuation--.
    Line 33, "Due" should read -- Due to the--.

COLUMN 2

Line 39, "is" should read --are--.
    Line 51, "change continuously" should read --continuously change--.

COLUMN 3

Line 25, "excited-within" should read --excited within--.

COLUMN 5

Line 42, "outlet," should read --outlet--.
    Line 44, "gate-gas." should read --gate gas.--.

UNITED STATES PATENT AND TRADEMARK OFFICE
CERTIFICATE OF CORRECTION

PATENT NO. : 5,468,521

DATED : November 21, 1995

INVENTOR(S): MASAHIRO KANAI ET AL.

It is certified that error appears in the above-identified patent and that said Letters Patent is hereby corrected as shown below:

COLUMN 8

Line 3, "is-generated" should read --is generated--.
    Line 14, "composition-in" should read --composition in--.

COLUMN 9

Line 10, "serves" should read --serves to--.
    Line 28, "exhaust-tube" should read --exhaust tube--.
    Line 30, "{s" should read --is--.

COLUMN 13

Line 62, "Ag," should be deleted.

COLUMN 14

Line 15, "a-SiC:K," should read --a-SiC:H,--.
    Line 39, "provided-the" should read --provided the--.
    Line 50, "a-SiCuiH" should read --a-SiCu:H--.

UNITED STATES PATENT AND TRADEMARK OFFICE
CERTIFICATE OF CORRECTION

PATENT NO. : 5,468,521

DATED : November 21, 1995

INVENTOR(S) : MASAHIRO KANAI ET AL.

It is certified that error appears in the above-identified patent and that said Letters Patent is hereby corrected as shown below:

COLUMN 19

Line 5, "under,the" should read --under the--.

COLUMN 21

Line 32, "containing-hydrogen" should read --containing hydrogen--.

COLUMN 30

Line 67, "$Ge_2H_3F_b,$" should read --$Ge_2H_3F_3,$--.

COLUMN 31

Line 51, "$Al(OCH3)_3,$" should read --$Al(OCH_3)_3,$--.

UNITED STATES PATENT AND TRADEMARK OFFICE
CERTIFICATE OF CORRECTION

PATENT NO. : 5,468,521

DATED : November 21, 1995

INVENTOR(S) : MASAHIRO KANAI ET AL.

It is certified that error appears in the above-identified patent and that said Letters Patent is hereby corrected as shown below:

COLUMN 33

Line 1, "gas;" should read --gas; and--.
    Line 28, "firm" should read --film--.
    Line 50, "sponge-shaped, or" should read --sponged-shaped and--.

COLUMN 34

Line 24, "elongated" should read --elongated substrate--.

Signed and Sealed this

Fourth Day of June, 1996

Attest:

BRUCE LEHMAN

*Attesting Officer*  *Commissioner of Patents and Trademarks*